United States Patent
Terlizzi et al.

(10) Patent No.: US 9,667,007 B2
(45) Date of Patent: May 30, 2017

(54) TECHNIQUES FOR CONFIGURING CONTACTS OF A CONNECTOR

(71) Applicant: Apple Inc., Cupertino, CA (US)

(72) Inventors: Jeffrey J. Terlizzi, San Francisco, CA (US); Scott Mullins, Gilroy, CA (US); Alexei Kosut, Mountain View, CA (US); Jahan Minoo, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/192,555

(22) Filed: Feb. 27, 2014

(65) Prior Publication Data

US 2014/0181328 A1    Jun. 26, 2014

Related U.S. Application Data

(63) Continuation of application No. 13/679,637, filed on Nov. 16, 2012, now Pat. No. 8,806,067, which is a
(Continued)

(51) Int. Cl.
*G06F 3/00* (2006.01)
*H01R 29/00* (2006.01)
(Continued)

(52) U.S. Cl.
CPC .......... *H01R 29/00* (2013.01); *G01R 31/08* (2013.01); *G06F 3/00* (2013.01); *G06F 9/4413* (2013.01);
(Continued)

(58) Field of Classification Search
None
See application file for complete search history.

(56) References Cited

U.S. PATENT DOCUMENTS

| 3,760,335 A | 9/1973 | Roberts |
| 4,461,529 A | 7/1984 | Fariss |

(Continued)

FOREIGN PATENT DOCUMENTS

| CN | 1397804 A | 2/2003 |
| CN | 1830122 A | 9/2006 |

(Continued)

OTHER PUBLICATIONS

Steve Venuti, Introducing HDMI 1.4 Specification Features, 2009, HDMI LLC, http://www.hdmi.org/download/press_kit/PressBriefing_HDMI1_4_Final_083109.pdf, pp. 29-30.*

(Continued)

*Primary Examiner* — Henry Tsai
*Assistant Examiner* — Christopher Bartels
(74) *Attorney, Agent, or Firm* — Kilpatrick Townsend & Stockton LLP

(57) ABSTRACT

Systems and methods for configuring contacts of a first connector includes detecting mating of a second connector with the first connector and in response to the detection, sending a command over one of the contacts and waiting for a response to the command. If a valid response to the command is received, the system determines the orientation of the second connector. The response also includes configuration information for contacts in the second connector. The system then configures some of the other contacts of the first connector based on the determined orientation and configuration information of the contacts of the second connector.

20 Claims, 13 Drawing Sheets

Related U.S. Application Data continuation of application No. 13/607,550, filed on Sep. 7, 2012, now Pat. No. 9,293,876.

(60) Provisional application No. 61/565,463, filed on Nov. 30, 2011, provisional application No. 61/556,792, filed on Nov. 7, 2011.

(51) Int. Cl.

| | | |
|---|---|---|
| *H01R 13/66* | (2006.01) | |
| *H01R 27/00* | (2006.01) | |
| *G01R 31/08* | (2006.01) | |
| *G06F 9/44* | (2006.01) | |
| *H01R 13/641* | (2006.01) | |
| *H01R 24/60* | (2011.01) | |

(52) U.S. Cl.
CPC ......... *H01R 13/641* (2013.01); *H01R 13/665* (2013.01); *H01R 13/6683* (2013.01); *H01R 13/6691* (2013.01); *H01R 27/00* (2013.01); *H01R 24/60* (2013.01); *Y10T 307/826* (2015.04)

(56) References Cited

U.S. PATENT DOCUMENTS

| | | |
|---|---|---|
| 4,468,612 A | 8/1984 | Starr |
| 4,792,986 A | 12/1988 | Garner et al. |
| 4,968,929 A | 11/1990 | Hauck et al. |
| 5,295,843 A | 3/1994 | Davis et al. |
| 5,380,225 A | 1/1995 | Inaoka |
| 5,387,110 A | 2/1995 | Kantner et al. |
| 5,442,243 A | 8/1995 | Bailey |
| 5,518,421 A | 5/1996 | Davis |
| 5,785,557 A | 7/1998 | Davis |
| 5,959,848 A | 9/1999 | Groves et al. |
| 6,012,105 A | 1/2000 | Rubbmark et al. |
| 6,073,201 A | 6/2000 | Jolley et al. |
| 6,145,037 A | 11/2000 | Sakakibara |
| 6,334,160 B1 | 12/2001 | Emmert et al. |
| 6,368,146 B2 | 4/2002 | Abbott |
| 6,452,402 B1 | 9/2002 | Kerai |
| 6,460,094 B1 | 10/2002 | Hanson et al. |
| 6,482,045 B2 | 11/2002 | Arai |
| 6,530,793 B2 | 3/2003 | Eichhorn et al. |
| 6,671,814 B1 | 12/2003 | Kubo et al. |
| 6,716,058 B2 | 4/2004 | Youn |
| 6,718,417 B1 | 4/2004 | Bachrach |
| 6,786,763 B2 | 9/2004 | Wu |
| 6,836,814 B2 | 12/2004 | Takaoka et al. |
| 6,846,202 B1 | 1/2005 | Schmidt et al. |
| 6,948,965 B2 | 9/2005 | Kumamoto et al. |
| 6,948,984 B2 | 9/2005 | Chen et al. |
| 6,962,510 B1 | 11/2005 | Chen et al. |
| 6,964,582 B2 | 11/2005 | Zhuang et al. |
| 6,973,658 B2 | 12/2005 | Nguyen |
| 6,981,887 B1 | 1/2006 | Mese et al. |
| 6,994,575 B1 | 2/2006 | Clark et al. |
| 7,039,731 B2 | 5/2006 | Hasegawa |
| 7,058,075 B1 | 6/2006 | Wong et al. |
| 7,094,086 B2 | 8/2006 | Teicher |
| 7,094,089 B2 | 8/2006 | Andre et al. |
| 7,104,848 B1 | 9/2006 | Chou et al. |
| 7,123,022 B2 | 10/2006 | Parker et al. |
| 7,160,125 B1 | 1/2007 | Teicher |
| 7,192,313 B2 | 3/2007 | Sai |
| 7,216,191 B2 | 5/2007 | Sagues et al. |
| 7,277,966 B2 | 10/2007 | Hanson et al. |
| 7,293,122 B1 | 11/2007 | Schubert et al. |
| 7,352,289 B1 | 4/2008 | Harris |
| 7,361,059 B2 | 4/2008 | Harkabi et al. |
| 7,363,947 B2 | 4/2008 | Teicher |
| 7,392,946 B2 | 7/2008 | Hellström et al. |
| 7,440,286 B2 | 10/2008 | Hiew et al. |
| 7,442,091 B2 | 10/2008 | Salomon et al. |
| 7,458,825 B2 | 12/2008 | Atsmon et al. |
| 7,463,042 B2 | 12/2008 | Pereira |
| 7,496,671 B2 | 2/2009 | Engel et al. |
| 7,500,861 B2 | 3/2009 | Harkabi et al. |
| 7,537,471 B2 | 5/2009 | Teicher |
| 7,589,536 B2 | 9/2009 | Terlizzi et al. |
| 7,591,657 B2 | 9/2009 | Teicher |
| 7,594,827 B2 | 9/2009 | Takamoto et al. |
| 7,716,400 B2 | 5/2010 | Raines |
| 7,717,717 B1 | 5/2010 | Lai |
| 7,722,409 B2 | 5/2010 | Takamoto et al. |
| 7,863,906 B2 | 1/2011 | Terlizzi et al. |
| 7,890,284 B2 | 2/2011 | Patterson et al. |
| 7,892,014 B2 | 2/2011 | Amidon et al. |
| 7,969,702 B2 | 6/2011 | Herrmann |
| 8,109,795 B2 | 2/2012 | Lin et al. |
| 8,277,258 B1 | 10/2012 | Huang et al. |
| 8,517,766 B2 | 8/2013 | Golko et al. |
| 8,535,075 B1 | 9/2013 | Golko et al. |
| 8,545,275 B2 | 10/2013 | Wang et al. |
| 8,686,600 B2 | 4/2014 | Terlizzi et al. |
| RE45,050 E | 7/2014 | Terlizzi et al. |
| 8,806,067 B2 * | 8/2014 | Terlizzi et al. ................. 710/3 |
| 8,911,260 B2 | 12/2014 | Golko et al. |
| RE45,492 E | 4/2015 | Terlizzi et al. |
| 8,998,632 B2 | 4/2015 | Golko et al. |
| 9,054,477 B2 | 6/2015 | Heley et al. |
| 9,093,803 B2 | 7/2015 | Soohoo et al. |
| 9,106,031 B2 | 8/2015 | Golko et al. |
| 9,118,990 B2 | 8/2015 | Hankey et al. |
| 9,142,926 B2 | 9/2015 | Tsai |
| 9,153,895 B2 | 10/2015 | Kao et al. |
| 9,160,115 B2 | 10/2015 | Kao et al. |
| 9,160,129 B2 | 10/2015 | Brickner et al. |
| 9,293,876 B2 | 3/2016 | Terlizzi et al. |
| 9,478,905 B2 | 10/2016 | Golko et al. |
| 2002/0081880 A1 | 6/2002 | Eichhorn et al. |
| 2003/0068033 A1 | 4/2003 | Kiko |
| 2003/0220988 A1 | 11/2003 | Hymel |
| 2004/0023560 A1 | 2/2004 | Swoboda |
| 2004/0259423 A1 | 12/2004 | Elbaz et al. |
| 2005/0014418 A1 | 1/2005 | Ji et al. |
| 2005/0015525 A1 | 1/2005 | Cahill et al. |
| 2005/0021890 A1 | 1/2005 | Baker et al. |
| 2005/0032426 A1 | 2/2005 | Tanaka |
| 2005/0042930 A1 | 2/2005 | Harkabi et al. |
| 2005/0079738 A1 | 4/2005 | Ahn |
| 2005/0097212 A1 | 5/2005 | Engel et al. |
| 2005/0124217 A1 | 6/2005 | Zhuang et al. |
| 2005/0124218 A1 | 6/2005 | Chen et al. |
| 2005/0124219 A1 | 6/2005 | Chen et al. |
| 2005/0246477 A1 | 11/2005 | Adams et al. |
| 2005/0251589 A1 * | 11/2005 | Wang .................. 710/5 |
| 2006/0019545 A1 | 1/2006 | Moriyama et al. |
| 2006/0024997 A1 | 2/2006 | Teicher |
| 2006/0047861 A1 | 3/2006 | Hung et al. |
| 2006/0047982 A1 | 3/2006 | Lo et al. |
| 2006/0156415 A1 | 7/2006 | Rubinstein et al. |
| 2006/0250764 A1 | 11/2006 | Howarth et al. |
| 2006/0294272 A1 * | 12/2006 | Chou et al. .................. 710/62 |
| 2007/0001691 A1 | 1/2007 | Pereira |
| 2007/0010115 A1 | 1/2007 | Teicher |
| 2007/0010116 A1 | 1/2007 | Teicher |
| 2007/0082634 A1 | 4/2007 | Thijssen et al. |
| 2007/0178771 A1 | 8/2007 | Goetz et al. |
| 2007/0201170 A1 | 8/2007 | Hooper |
| 2007/0202725 A1 | 8/2007 | Teicher |
| 2007/0245058 A1 | 10/2007 | Wurzburg et al. |
| 2007/0287302 A1 | 12/2007 | Lindberg et al. |
| 2008/0119076 A1 | 5/2008 | Teicher |
| 2008/0156885 A1 * | 7/2008 | Landau ................ G06K 19/077 235/492 |
| 2008/0164934 A1 | 7/2008 | Hankey et al. |
| 2008/0167828 A1 | 7/2008 | Terlizzi et al. |
| 2008/0274633 A1 | 11/2008 | Teicher |
| 2008/0320190 A1 | 12/2008 | Lydon et al. |
| 2009/0011621 A1 | 1/2009 | Trenne |
| 2009/0061678 A1 | 3/2009 | Minoo et al. |

(56) References Cited

U.S. PATENT DOCUMENTS

| | | |
|---|---|---|
| 2009/0108848 A1 | 4/2009 | Lundquist et al. |
| 2009/0132076 A1 | 5/2009 | Holden et al. |
| 2009/0149049 A1 | 6/2009 | Harkabi et al. |
| 2009/0193180 A1 | 7/2009 | Ito |
| 2009/0267613 A1 | 10/2009 | Terlizzi et al. |
| 2010/0075604 A1 | 3/2010 | Lydon et al. |
| 2010/0080563 A1 | 4/2010 | DiFonzo et al. |
| 2010/0081337 A1 | 4/2010 | Dorogusker et al. |
| 2010/0115817 A1 | 5/2010 | Faifer |
| 2010/0118932 A1 | 5/2010 | Luo et al. |
| 2010/0171465 A1 | 7/2010 | Seal et al. |
| 2010/0173533 A1 | 7/2010 | Yang et al. |
| 2010/0180063 A1 | 7/2010 | Ananny et al. |
| 2010/0235546 A1 | 9/2010 | Terlizzi et al. |
| 2010/0254662 A1 | 10/2010 | He et al. |
| 2010/0262744 A1* | 10/2010 | Deva et al. ............... 710/302 |
| 2010/0279554 A1 | 11/2010 | Steijner |
| 2011/0055407 A1 | 3/2011 | Lydon et al. |
| 2011/0093624 A1* | 4/2011 | Crumlin ............ H01R 13/7039 710/16 |
| 2011/0126005 A1* | 5/2011 | Carpenter et al. ............ 713/158 |
| 2011/0167176 A1 | 7/2011 | Yew et al. |
| 2011/0263141 A1 | 10/2011 | Ko |
| 2011/0317835 A1* | 12/2011 | Laird et al. ................ 380/255 |
| 2012/0047368 A1 | 2/2012 | Chinn et al. |
| 2012/0149244 A1 | 6/2012 | Zheng et al. |
| 2012/0270419 A1 | 10/2012 | Shahoian et al. |
| 2013/0075149 A1 | 3/2013 | Golko et al. |
| 2013/0078869 A1 | 3/2013 | Golko et al. |
| 2013/0089291 A1 | 4/2013 | Jol et al. |
| 2013/0095701 A1 | 4/2013 | Golko et al. |
| 2013/0095702 A1 | 4/2013 | Golko et al. |
| 2013/0115817 A1 | 5/2013 | Terlizzi et al. |
| 2013/0117470 A1 | 5/2013 | Terlizzi et al. |
| 2013/0122754 A1* | 5/2013 | Golko ................. H01R 13/516 439/676 |
| 2013/0217253 A1 | 8/2013 | Golko et al. |
| 2013/0244489 A1 | 9/2013 | Terlizzi et al. |
| 2013/0286523 A1* | 10/2013 | Mullins ................ G06F 1/3231 361/93.9 |
| 2014/0075067 A1 | 3/2014 | Mullins et al. |
| 2014/0170907 A1 | 6/2014 | Golko et al. |

FOREIGN PATENT DOCUMENTS

| | | |
|---|---|---|
| CN | 1878370 A | 12/2006 |
| CN | 1905286 A | 1/2007 |
| CN | 101116227 A | 1/2008 |
| CN | 201256225 Y | 6/2009 |
| CN | 201509210 | 6/2010 |
| CN | 101782888 A | 7/2010 |
| CN | 203218514 U | 9/2013 |
| DE | 19609571 | 5/1997 |
| DE | 202004012084 U1 | 11/2004 |
| DE | 202004021354 U1 | 9/2007 |
| EP | 1684391 A2 | 7/2006 |
| EP | 1717910 A2 | 11/2006 |
| EP | 2034423 A2 | 3/2009 |
| EP | 2169774 A1 | 3/2010 |
| EP | 2373131 A1 | 10/2011 |
| EP | 2590274 | 5/2013 |
| FR | 2138961 A1 | 1/1973 |
| JP | 6155974 A | 6/1994 |
| JP | H06231821 A | 8/1994 |
| JP | 08321360 A | 12/1996 |
| JP | 2001223057 A | 8/2001 |
| JP | 2003217728 A | 7/2003 |
| JP | 2004079491 | 3/2004 |
| JP | 2004319371 A | 11/2004 |
| JP | 2008041656 A | 2/2008 |
| JP | 2008508694 A | 3/2008 |
| JP | 2009117128 A | 5/2009 |
| JP | 2010067459 A | 3/2010 |
| KR | 1020060123435 | 12/2006 |
| KR | 1020070039956 A | 4/2007 |
| KR | 1020090056918 | 6/2009 |
| KR | 1020110065543 A | 6/2011 |
| TW | 200534675 A | 10/2005 |
| TW | M327102 U | 2/2008 |
| TW | 201021329 A | 6/2010 |
| TW | 201101601 A | 1/2011 |
| WO | 2002008872 A1 | 1/2002 |
| WO | 2004097995 | 11/2004 |
| WO | 2005013436 A1 | 2/2005 |
| WO | 2006013553 A2 | 2/2006 |
| WO | 2007090069 A2 | 8/2007 |
| WO | 2008065659 A2 | 6/2008 |
| WO | 2009069969 A2 | 6/2009 |
| WO | 2009140992 | 11/2009 |
| WO | 2010039656 A1 | 4/2010 |
| WO | 2010141147 A1 | 12/2010 |
| WO | 2011043488 A1 | 4/2011 |
| WO | 2011150403 A1 | 12/2011 |
| WO | 2012086145 A1 | 6/2012 |
| WO | 2012103383 A2 | 8/2012 |
| WO | 2012103393 A2 | 8/2012 |
| WO | 2013070753 A2 | 5/2013 |

OTHER PUBLICATIONS

Non-Final Office Action for U.S. Appl. No. 13/721,522, mailed May 22, 2013, 17 pages.
Non-Final Office Action for U.S. Appl. No. 13/679,637, mailed Apr. 22, 2013, 37 pages.
Partial European Search Report for European Application No. 12191580.5, mailed Aug. 21, 2013, 6 pages.
Final Office Action for U.S. Appl. No. 13/679,637, mailed Sep. 5, 2013, 29 pages.
International Search Report and Written Opinion for International PCT Application No. PCT/US2012/063928, mailed Sep. 9, 2013, 19 pages.
Notice of Allowance for U.S. Appl. No. 13/721,522, mailed Nov. 14, 2013, 19 pages.
Extended European Search Report for European Application No. 12191580.5, mailed Dec. 11, 2013, 10 pages.
Notice of Allowance for U.S. Appl. No. 13/679,637, mailed Dec. 17, 2013, 9 pages.
International Preliminary Report on Patentability for International PCT Application No. PCT/US2012/063928, mailed May 22, 2014, 14 pages.
Supplemental Notice of Allowance for U.S. Appl. No. 13/679,637, mailed Jul. 8, 2014, 4 pages.
Non-Final Office Action for U.S. Appl. No. 13/607,550, mailed Aug. 14, 2015, 14 pages.
Australia Patent Application No. 2015230752, "First Examiner's Report", mailed Apr. 1, 2016, 2 pages.
Australia Patent Application No. 2015230752, "Notice of Acceptance", mailed Sep. 15, 2016, 2 pages.
Canada Patent Application No. 2,794,877, "Office Action", mailed Sep. 23, 2014, 3 pages.
United Kingdom Patent Application No. 1220073.9, "Notice of Acceptance", mailed May 20, 2014.
United Kingdom Patent Application No. 1220073.9, "Office Action", mailed Jan. 16, 2014, 3 pages.
United Kingdom Patent Application No. 1322782.2, "Office Action", mailed May 30, 2014, 6 pages.
United Kingdom Patent Application No. 1220073.9, Office Action, mailed Mar. 22, 2013, 6 pages.
United Kingdom Patent Application No. 1322782.2, "Office Action", mailed Oct. 14, 2014, 4 pages.
United Kingdom Patent Application No. 1322782.2, "Office Action", mailed Jan. 21, 2015, 5 pages.
Canada Patent Application No. 2,794,877, "Notice of Allowance", mailed Sep. 2, 2015, 1 page.
Canada Patent Application No. 2,794,877, "Office Action", mailed Nov. 8, 2013, 3 pages.
Chinese Patent Application No. 201210442307.8 "Decision to Grant", mailed Nov. 12, 2015, 2 pages.

(56) References Cited

OTHER PUBLICATIONS

Chinese Patent Application No. 201210442307.8 "Office Action", mailed May 11, 2015, 5 pages.
Chinese Patent Application No. 201210442307.8 "Office Action", mailed Sep. 4, 2015, 12 pages.
Chinese Patent Application No. 201220584711.4, "Office Action", mailed Mar. 15, 2013, 4 pages.
European Patent Application No. 12191580.5, "Office Action", mailed Jan. 28, 2016, 4 pages.
Japanese Patent Application No. 2014-540217, "Office Action", mailed Mar. 2, 2015, 4 pages.
Japanese Patent Application No. 2014-540217, "Office Action", mailed Jun. 19, 2015, 4 pages.
Korean Patent Application No. 10-2012-0125748, "Notice of Allowance", mailed Apr. 23, 2015, 2 pages.
Korean Patent Application No. 10-2012-0125748, "Office Action", mailed Aug. 28, 2014, 6 pages.
Korean Patent Application No. 10-2012-0125748, "Office Action", mailed Jan. 21, 2014, 6 pages.
Mexico Patent Application No. MX/a/2014/005449, "Notice of Allowance", mailed Jun. 8, 2015, 1 page.
International Patent Application No. PCT/US2012/063928, "Invitation to Pay Additional Fees and Partial Search Report", mailed Mar. 22, 2013, 8 pages.
Taiwan Patent Application No. 101141386, "Office Action", mailed Aug. 3, 2015, 21 pages.
Singapore Patent Application No. 11201401609U, "Notice of Decision to Grant", mailed Jul. 26, 2016, 4 pages.
Vietnam Patent Application No. N1-2014-01747, "Office Action", mailed Oct. 21, 2016, 1 page.
"Notice of Allowance", U.S. Appl. No. 13/607,550, mailed Dec. 18, 2015, 7 pages.
Russian Patent Application No. 2014123026, "Office Action", mailed Apr. 7, 2015, 8 pages.
Taiwan Patent Application No. 101141386, "Notice of Decision to Grant", mailed Jun. 3, 2016, 3 pages.
U.S. Appl. No. 13/679,637, "Notice of Allowance", mailed Jul. 8, 2014, 4 pages.
Levy, "Flipper USB product advertisement, press releases, and news articles", available online at : http://www.flipperusb.com, Jun. 25, 2010, 1 page.

* cited by examiner

| ACC1 | Data A+ | Data A- | P_IN | P_IN | Data B- | Data B+ | ACC2 |
|---|---|---|---|---|---|---|---|
| 206(1) | 206(2) | 206(3) | 206(4) | 206(5) | 206(6) | 206(7) | 206(8) |

*Fig. 2E*

| GND | Data A+ | Data A- | ACC1 | P_IN | Data B- | Data B+ | ACC2 |
|---|---|---|---|---|---|---|---|
| 206(1) | 206(2) | 206(3) | 206(4) | 206(5) | 206(6) | 206(7) | 206(8) |

*Fig. 2F*

Rotate Connector

Rotate Connector 100 by 180 degrees

TECHNIQUES FOR CONFIGURING CONTACTS OF A CONNECTOR

CROSS-REFERENCES TO RELATED APPLICATIONS

This application is a continuation of U.S. patent application Ser. No. 13/679,637 filed on Nov. 16, 2012, which is a continuation of Ser. No. 13/607,550 filed on Sep. 7, 2012, which in turn claims benefit under 35 USC §119(e) to (a) U.S. Provisional Patent Application No. 61/556,792, filed on Nov. 7, 2011 and (b) U.S. Provisional Patent Application No. 61/565,463, filed on Nov. 30, 2011, the disclosures of which are incorporated by reference in their entirety for all purposes.

This application is related to U.S. patent application Ser. No. 13/607,426, filed on Sep. 7, 2012, the contents of which are incorporated by reference herein in its entirety for all purposes.

BACKGROUND OF THE INVENTION

Connectors are ubiquitous and are used in variety of applications for coupling two electronic devices. Most connectors usually have some sort of contacts that facilitate transmission of signals between the devices connected using a connector. Conventionally, each contact in a connector has a specific pre-assigned function. In other words, each contact in a connector is designated to carry a certain type of signal, e.g., power, data, etc.

Many electrical connectors can only be connected in a single orientation. These connectors have contacts that have pre-assigned functions which cannot be modified. Usually, these electrical connectors have a physical design that allows for connection only in a single orientation. In other words, two mating single orientation connectors can only be mated one way. Thus, one has to be careful when using a single orientation connector since plugging the connector in an incorrect manner can damage the connector and/or damage the device into which the connector is plugged in either physically, electrically, or both.

BRIEF SUMMARY OF THE INVENTION

The present invention generally relates to connectors for connecting two devices. Specifically, certain embodiments of the present invention relate to reversible connectors with configurable contacts. As described above, conventional connectors have contacts that have pre-assigned function. For example, in a standard USB connector, each of the four contacts has a specific function associated with it, e.g., power, data, etc. The location of these pre-assigned contacts within the connector is also fixed. In sum, the contacts in such conventional connectors are not configurable and can perform only the pre-assigned function based on the type and use of the connector.

Embodiments of the present invention provide techniques for dynamically configuring contacts of a host-side connector that is associated with a host system. In one embodiment of the present invention, a contact in the host-side connector is capable of being assigned one of several functions. The function to be assigned to the contact (and other contacts in the connector) may depend on the accessory coupled to the host system and the signals provided/used by the accessory. For example, when an audio only accessory is coupled to the host system, at least one of the contacts on the host-side connector can be configured to carry audio data.

In some embodiments, a host-side connector and an accessory-side connector can mate with each other in more than one orientation. In the instance where the host-side connector and the accessory-side connector can mate with each other in more than one orientation, it may be beneficial to first determine the orientation of the accessory-side connector with respect to the host-side connector before configuring the contacts of the host-side connector.

Certain embodiments of the present invention provide techniques for determining orientation of an accessory-side connector with respect to a corresponding host-side connector. According to one embodiment, once the accessory-side connector is physically mated with the host-side connector, the host system sends a command to the accessory alternately over each of two selected contacts in the host-side connector and awaits a reply from the accessory. Depending over which of the two selected contacts the reply is received on, the host system can determine the orientation of the accessory-side connector with respect to the host-side connector.

In other embodiments, the contacts in the host-side connector are configured based on the determined orientation of the accessory-side connector. In an embodiment, the reply from the accessory may include information about the function assigned to each contact of the accessory-side connector. Using this information and the knowing the orientation of the accessory-side connector, the host system can then configure the contacts of the host-side connector in order to communicate with the accessory.

In some embodiments, the detection of orientation and configuration of contacts can be independent of each other. In other embodiments, the detection of orientation may precede and may be used to configure the contacts of the host-side connector. In some embodiments, the contacts of the host-side connector can be in a floating mode prior to mating with the accessory-side connector.

The following detailed description, together with the accompanying drawings will provide a better understanding of the nature and advantages of the present invention.

BRIEF DESCRIPTION OF THE DRAWINGS

FIGS. 2E and 2F are diagrams illustrating a pinout arrangement of a receptacle connector according to two different embodiments of the invention configured to mate with plug connectors 100 and 101, respectively, as shown in FIGS. 1D and 1E.

DETAILED DESCRIPTION OF THE INVENTION

Embodiments of the present invention generally relate to connectors. More specifically, certain embodiments of the present invention provide techniques for determining orientation of one connector with respect to another connector. In some embodiments, an accessory-side or "plug" connector may be insertable into a host-side or "receptacle" connector in more than one orientation. In this instance, the techniques described herein may provide a method to determine the exact orientation of the plug connector with respect to the receptacle connector.

Some embodiments of the present invention provide techniques for dynamically configuring contacts of a host-side connector based on information received from a connected accessory.

Certain embodiments of the present invention provide systems and methods for determining orientation of an accessory-side connector with respect to a host-side connector and configuring the host-side connector based on the determined orientation and information received from the accessory.

Figure 1A:
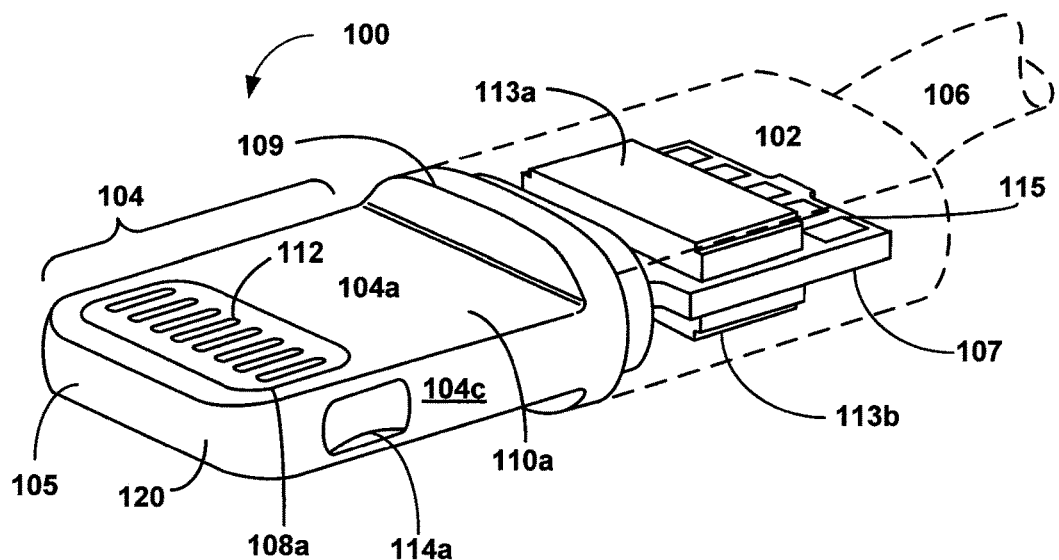
FIG. 1A illustrates a plug connector according to an embodiment of the present invention.

FIG. 1A illustrates a plug connector 100 (or accessory-side connector 100) according to an embodiment of the present invention. Plug connector 100 is exemplary and is used herein to explain the various embodiments of the present invention. One skilled in the art will realize that many other forms and types of connectors other than plug connector 100 can be used and that techniques described herein will apply to any plug connector that has the characteristics of plug connector 100. In some embodiments, plug connector 100 may be associated with an accessory that can be coupled to a host device.

Plug connector 100 includes a body 102 and a tab portion 104. A cable 106 is attached to body 102 and tab portion 104 and extends longitudinally away from body 102 in a direction parallel to the length of the connector 100. Tab 104 is sized to be inserted into a corresponding receptacle connector during a mating event and includes a first contact region 108a formed on a first major surface 104a and a second contact region 108b (not shown in FIG. 1A) formed at a second major surface 104b (also not shown in FIG. 1A) opposite surface 104a. Surfaces 104a, 104b extend from a distal tip of the tab to a spine 109 that, when tab 104 is inserted into a corresponding receptacle connector, abuts a housing of the receptacle connector or portable electronic device the receptacle connector is incorporated in. Tab 104 also includes first and second opposing side surfaces 104c, 104d (not shown) that extend between the first and second major surfaces 104a, 104b. In one particular embodiment, tab 104 is about 6.6 mm wide, about 1.5 mm thick and has an insertion depth (the distance from the tip of tab 104 to spine 109) of about 7.9 mm.

A plurality of contacts 112 can be formed in each of contact regions 108a and 108b such that, when tab 104 is inserted into a corresponding receptacle connector, contacts 112 in regions 108a or 108b are electrically coupled to corresponding contacts in the receptacle connector. In some embodiments, contacts 112 are self-cleaning wiping contacts that, after initially coming into contact with a receptacle connector contact during a mating event, slide further past the receptacle connector contact with a wiping motion before reaching a final, desired contact position.

As an example, in one embodiment an ID module is embodied within an IC operatively coupled to the contacts of connector 100. The ID module can be programmed with identification and configuration information about the connector and/or its associated accessory/adapter that can be communicated to a host device during a mating event. As another example, an authentication module programmed to perform an authentication routine, for example a public key encryption routine, with circuitry on the host device can be embodied within an IC operatively coupled to connector 100. The ID module and authentication module can be embodied within the same IC or within different ICs. As still another example, a current regulator can be embodied within one of IC's 113a or 113b. The current regulator can be operatively coupled to contacts that are able to deliver power to charge a battery in the portable electronic device and regulate current delivered over those contacts to ensure a constant current regardless of input voltage and even when the input voltage varies in a transitory manner. The function of the IC's is further described below in reference to FIG. 4.

Bonding pads 115 can also be formed within body 102 near the end of PCB 107. Each bonding pad can be connected to a contact or contact pair within regions 108a and 108b. Wires (not shown) can then be soldered to the bonding pads to provide an electrical connection from the contacts to circuitry within an accessory associated with connector 100. In some embodiments, however, bonding pads are not necessary and instead all electrical connections between the contacts and components of connector 100 and other circuitry within an accessory are made through traces on a PCB that the circuitry is coupled to and/or by interconnects between multiple PCBs within the accessory.

The structure and shape of tab 104 is defined by a ground ring 105 that can be made from stainless steel or another hard conductive material. Connector 100 includes retention features 114a, 114b (not shown) formed as curved pockets in the sides of ground ring 105 that double as ground contacts. Body 102 is shown in FIG. 1A in transparent form (via dotted lines) so that certain components inside the body are visible. As shown, within body 102 is a printed circuit board (PCB) 107 that extends into ground ring 105 between contact regions 108a and 108b towards the distal tip of connector 100. One or more integrated circuits (ICs), such as Application Specific Integrated Circuit (ASIC) chips 113a and 113b, can be operatively coupled to PCB 107 to provide information regarding connector 100 and/or to perform specific functions, such as authentication, identification, contact configuration and current or power regulation.

Figure 1B:
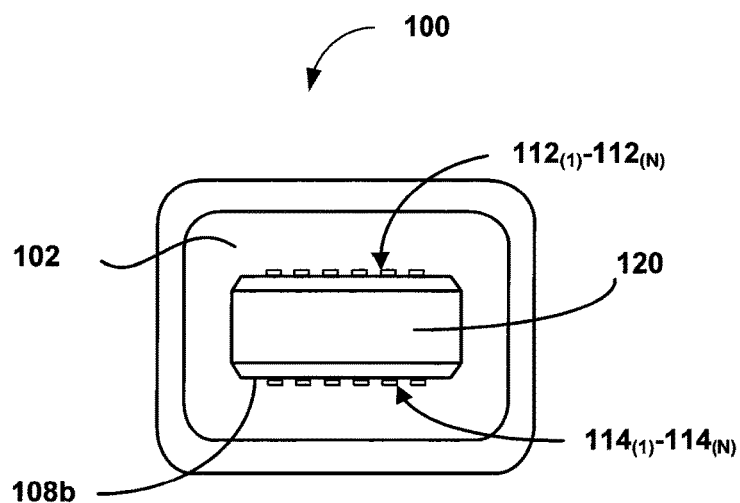
FIG. 1B is a front view of the plug connector according to an embodiment of the present invention.

FIG. 1B illustrates a front view of plug connector 100. The front view illustrates a cap 120. Cap 120 can be made from a metal or other conductive material and can extend from the distal tip of connector 100 along the side of the connector towards body 102 either fully or partially surrounding contacts 112 formed in contact regions 108a and 108b in the X and Y directions. In some embodiments, cap 120 can be grounded in order to minimize interference that may otherwise occur on contacts 112 of connector 100 and can thus be referred to as a ground ring, e.g., ground ring 105 illustrated in FIG. 1A. Contacts $112_{(1)}$-$112_{(N)}$ can be positioned within contact region 108a and additional contacts $114_{(1)}$-$114_{(N)}$ can be positioned within region 108b on the opposing surface of tab 104. In some embodiments, N can be between 2 and 8. Contacts $112_{(1)}$ ... $112_{(N)}$ and $114_{(1)}$ ... $114_{(N)}$ can be used to carry a wide variety of signals including digital signals and analog signals as well as power and ground.

Figure 1C:
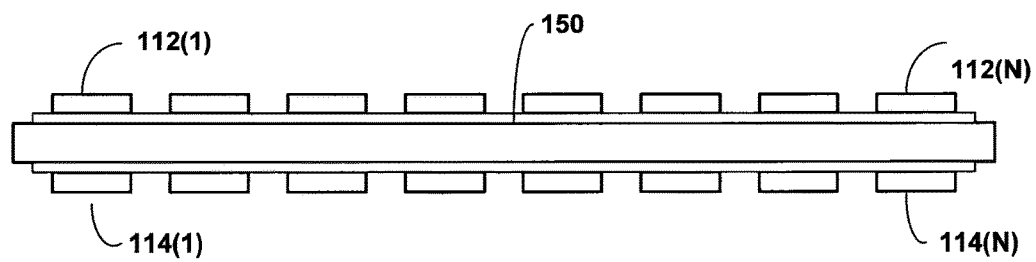
FIG. 1C is cross-sectional view of the plug connector according to an embodiment of the present invention.

FIG. 1C illustrates a cross-sectional schematic view of contacts 112, 114 and positioning of the contacts. Contacts 112, 114 can be mounted on either side of a PCB 150 as illustrated. In some embodiments, opposing contacts, e.g., $112_{(1)}$ and $114_{(1)}$ may be shorted or electrically connected to each other through PCB 150, e.g., using a via, to create an in-line connector design. In other embodiments, all contacts may be independent with no connections between any of the contacts or the contacts may have other connections schemes between them. In the instance where each contacts is independent and not connected to any other contact, a different receptacle connector, e.g., connector 250 of FIG. 2C, may be used. Contacts 112, 114 can be made from a copper, nickel, brass, a metal alloy or any other appropriate conductive material. Spacing is consistent between each of the contacts on the front and back sides and between the contacts and the edges of the connector providing 180 degree symmetry so that plug connector 100 can be inserted into a corresponding receptacle connector in either of two orientations.

When connector 100 is properly engaged with a receptacle connector, each of contacts $112_{(1)}$-$112_{(N)}$ or $114_{(1)}$-$114_{(N)}$ is in electrical connection with a corresponding contact of the receptacle connector.

Figure 1D:
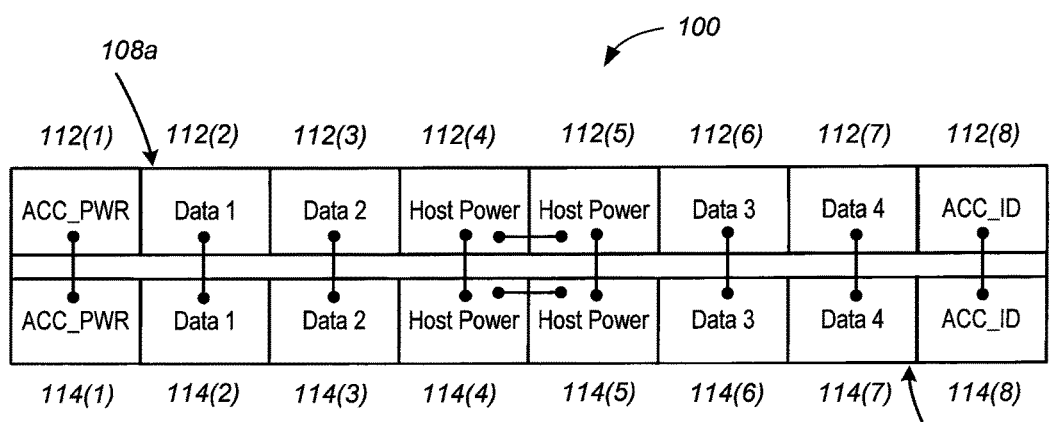
FIG. 1D is a pin-out of a plug connector according to an embodiment of the present invention.

FIG. 1D illustrates a pin-out configuration for connector 100 according one particular embodiment of the present invention as described in connection with FIG. 1C above.

The pin-out shown in FIG. 1D incldes four contacts 112(4), 112(5), 114(4), and 114(5) that are electrically coupled together to function as a single contact dedicated to carrying power to a connected host device. Connector 100 may also include accessory ID contacts 112(8) and 114(8); accessory power contacts 112(1) and 114(1); and eight data contacts arranged in four pairs. The four pairs of data contacts may be (a) 112(2) and 112(3), (b) 112(6) and 112(7), (c) 114(2) and 114(3), and (d) 114(6) and 114(7). Host power contacts 112(4), 112(5), 114(4), and 114(5) carry power from an accessory associated with connector 100 to a portable electronic device that is coupled to the accessory via connector 100. The host power contacts can be sized to handle any reasonable power requirement for an electronic device or host device, and for example, can be designed to carry between 3-20 Volts from an accessory to charge the portable electronic device connected to connector 100. In this embodiment, host power contacts 112(4), 112(5), 114(4), and 114(5) are positioned in the center of contact regions 108a, 108b to improve signal integrity by keeping power as far away as possible from the sides of ground ring 105.

Accessory power contacts 112(1) and 114(1) can be used for an accessory power signal that provides power from the electronic device (i.e. the host device) to an accessory. The accessory power signal is typically a lower voltage signal than the host power in signal received over host power contacts 112(4) and 112(5), for example, 3.3 volts as compared to 5 volts or higher. The accessory ID contacts provide a communication channel that enables the host device to authenticate the accessory and enable the accessory to communicate information to the host device about the accessory's capabilities as described in more detail below.

The four pairs of data contacts (a) 112(2) and 112(3), (b) 112(6) and 112(7), (c) 114(2) and 114(3), and (d) 114(6) and 114(7) may be used to enable communication between the host and accessory using one or more of several different communication protocols. For example, data contacts 112(2) and 112(3) are positioned adjacent to and on one side of the power contacts, while data contacts 112(6) and 112(7) are positioned adjacent to but on the other side of the power contacts. A similar arrangement of contacts can be seen for contacts 114 on the other surface of the PCB. The accessory power and accessory ID contacts are positioned at each end of the connector. The data contacts can be high speed data contacts that operate at rate that is two or three orders of magnitude faster than any signals sent over the accessory ID contact which makes the accessory ID signal look essentially like a DC signal to the high speed data lines. Thus, positioning the data contacts between the power contacts and the ID contact improves signal integrity by sandwiching the data contacts between contacts designated for DC signals or essentially DC signals.

Figure 1E:
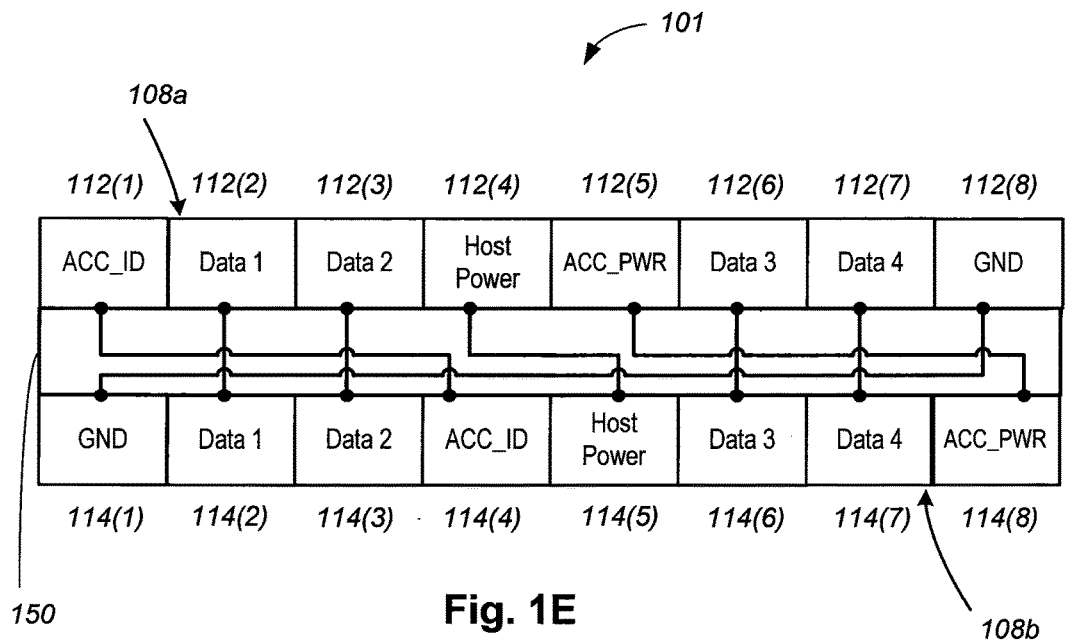
FIG. 1E is a pin-out of a plug connector according to another embodiment of the present invention.

FIG. 1E illustrates a pin-out configuration for a connector 101 according another particular embodiment of the present invention.

Connector 101 is a also a reversible connector just like connector 100. In other words, based on the orientation in which connector 101 is mated with a corresponding connector of a host device, either the contacts on the surface 108a or 108b are in physical and electrical contact with the contacts in the corresponding connector of the host device. As illustrated in FIG. 1E, connector 101 may have eight contacts arranged on an upper surface of a PCB 150 and eight contacts arranged on a lower surface of PCB 150.

Connector 101 includes two contacts 112(1) and 114(4) that can function as accessory ID contacts to carry the identification signals between the accessory and the portable electronic device. Contacts 112(1) and 114(4) are electrically connected to each other as illustrated in FIG. 1E. Connector 101 can have four pairs of data contacts, (a) 112(2) and 112(3), (b) 112(6) and 112(7), (c) 114(2) and 114(3), and (d) 114(6) and 114(7). In this particular embodiment, opposing data contacts, e.g., 112(2) and 114(2), are electrically connected to each other via PCB 150 as illustrated in FIG. 1E. Connector 101 may further include host power contacts 112(4) or 114(5) that may be electrically connected to each other. Host power contacts 112(4) or 114(5) can carry power to the host device that is mated with connector 101. For example, plug connector 101 may be part of a power supply system designed to provide power to the host device. In this instance, either contact 112(4) or 114(5) may carry power from the power supply to the host device, e.g., to charge a battery in the host device.

Connector 101 may further include accessory power contacts 112(5) and 114(8) that may be electrically connected to each other, e.g., via PCB 150. Accessory power contacts carry power from the host device to a connected accessory. For example, in some instances, an accessory connected to the host device may not be self-powered and may derive its power from the host device. In this instance, the host device can supply power to the accessory over either of the accessory contacts, depending on the orientation of connector 101 with respect to a corresponding connector of the host device. Connector 101 may further include two ground contacts 112(8) and 114(1) electrically connected to each other. The ground contacts provide a ground path for connector 101.

Figure 2A:
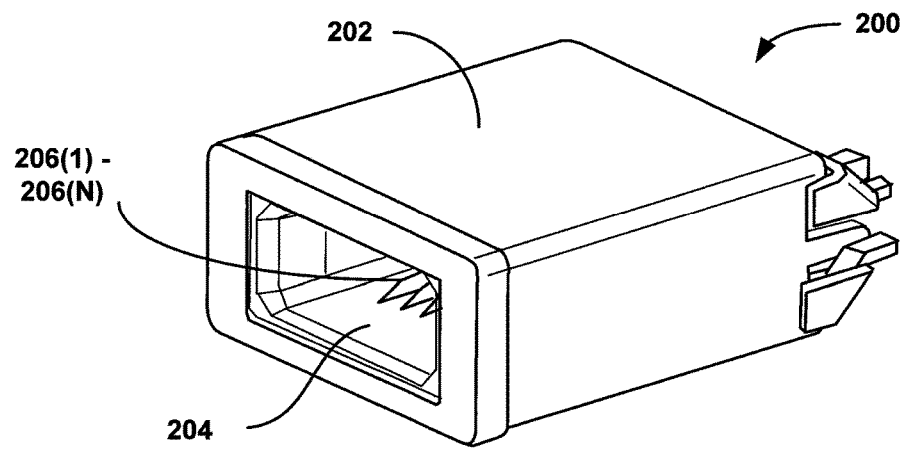
FIG. 2A illustrates a receptacle connector according to an embodiment of the present invention.

FIG. 2A illustrates a receptacle connector 200 according to an embodiment of the present invention. Receptacle connector 200 includes a housing 202 that defines a cavity 204 and houses N contacts $206_{(1)}$-$206_{(N)}$ within the cavity. In operation, a connector plug, such as plug connector 100 (or connector 101) can be inserted into cavity 204 to electrically couple the contacts $112_{(1)}$-$112_{(N)}$ or $114_{(1)}$-$114_{(N)}$ to respective contacts $206_{(1)}$-$206_{(N)}$. Each of the receptacle connector contacts $206_{(1)}$-$206_{(N)}$ electrically connects its respective plug contact to circuitry associated with the electrical/host device in which receptacle connector 200 is housed. For example, receptacle connector 200 can be part of a portable media device and electronic circuitry associated with the media device is electrically connected to receptacle 200 by soldering tips of contacts $206_{(1)}$-$206_{(N)}$ that extend outside housing 202 to a multilayer board such as a printed circuit board (PCB) within the portable media device. Note that connector 200 includes contacts on just a single side so it can be made thinner. In other embodiments, connector 200 may have contacts on each side.

Figure 2B:
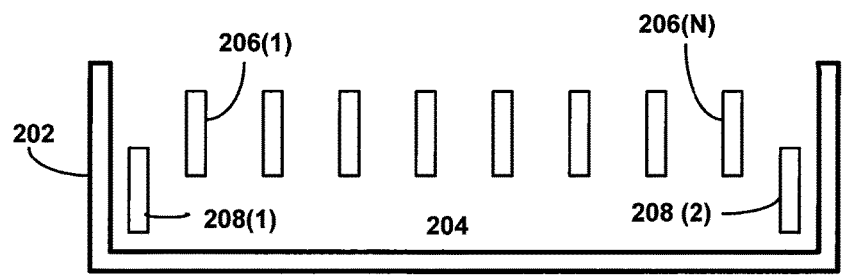
FIG. 2B cross-sectional view of the receptacle connector according to an embodiment of the present invention.

FIG. 2B illustrates a cross section view of receptacle connector 200 according to an embodiment of the present invention. As illustrated, in some embodiments, Additional contacts $208_{(1)}$ and $208_{(2)}$ are located at either ends of contacts $206_{(1)}$-$206_{(N)}$. Contacts $208_{(1)}$ and $208_{(2)}$ may be used to detect whether the plug connector is fully inserted into cavity 204 or inserted to a point where contacts 112 (or 114) of plug connector 100 (or connector 101) are physically coupled to contacts 206 of receptacle connector 200. In some embodiments, contacts $208_{(1)}$ and $208_{(2)}$ can also be used to detect whether the plug connector has been disconnected from the receptacle connector. In some embodiments, contacts 208 can make contact with cap 120 of plug connector 100 when the plug connector is inserted beyond a certain distance within cavity 204. In some embodiments, contacts 208 are placed such that they will make contact with the ground ring of plug connector only when contacts 112 make a solid physical connection with contacts 206. In some embodiments, when contacts 208 connect to the ground ring of the plug connector, a signal may be generated indicating the connection.

Figure 2C:
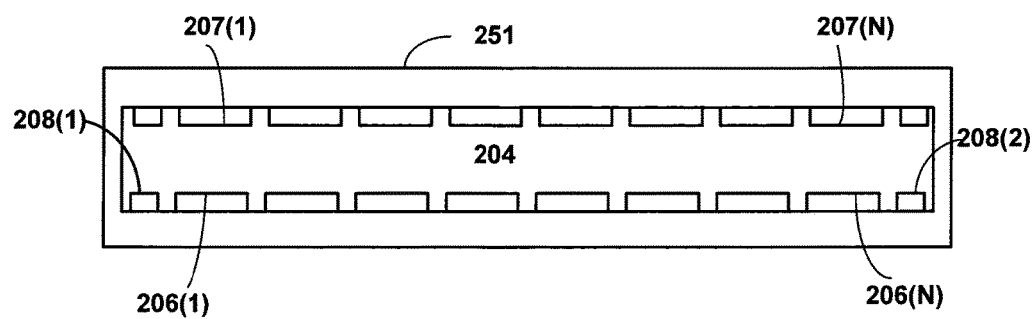
FIG. 2C illustrates a receptacle connector according to another embodiment of the present invention.

In some embodiments, the receptacle connector may have contacts both on the top side and the bottom side of cavity 204. FIG. 2C illustrates a cross-sectional view of a receptacle connector 251 that includes contacts $207_{(1)}$-$207_{(N)}$ on the top and contacts $206_{(1)}$-$206_{(N)}$ on the bottom. In some embodiments, a plug connector with electrically isolated contacts on the top and the bottom side may use the receptacle connector 251 of FIG. 2C.

Figure 2D:
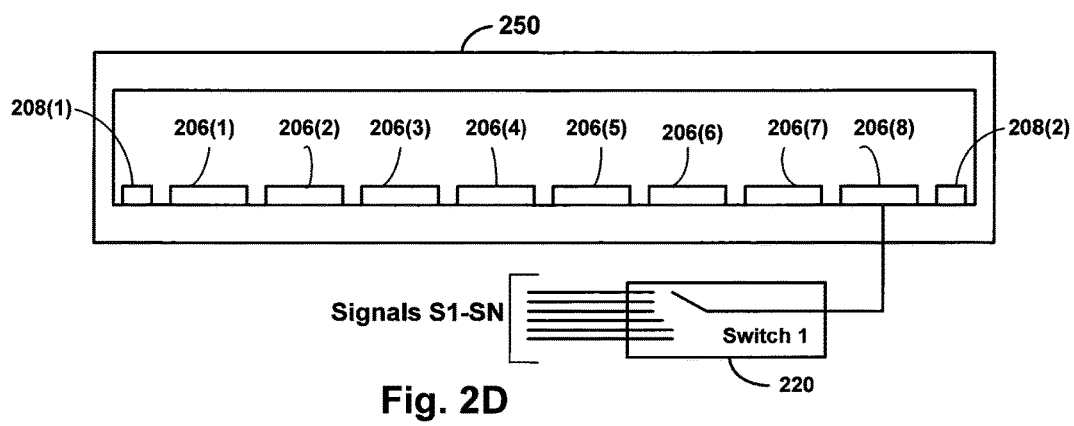
FIG. 2D is a cross-sectional view of a receptacle connector having eight signal contacts and two connection detection contacts according to an embodiment of the present invention.

In some embodiments, the receptacle connector may have contacts $206_{(1)}$-$(N)$ only on a single side inside cavity 204 as described above. In a particular embodiment, receptacle connector 250 may have eight (8) contacts $206_{(1)}$-$206_{(8)}$ as illustrated in FIG. 2D. Some or all of these contacts may be configured to perform one of several functions depending on the signals available on a plug connector. Plug connector 100 (or connector 101) may be associated any one of several accessories that may be designed to work with a host device that is associated with receptacle connector 250. For example, plug connector 100 (or connector 101) may be associated with an audio only accessory in which case the signals available on the contacts, e.g., $106_{(1)}$-$106_{(N)}$, of the plug connector may include audio and related signals. In other instances, where plug connector 100 (or connector 101) is associated with a more complex accessory such as video accessory, the contacts of plug connector may carry audio, video, and related signals. Thus, in order to enable receptacle connector 250 to be operable with various different types of signal, contacts $206_{(1)}$-$(8)$ of receptacle connector 250 can be made configurable based on the signals available from a plug connector 100 (or connector 101).

Figure 4:
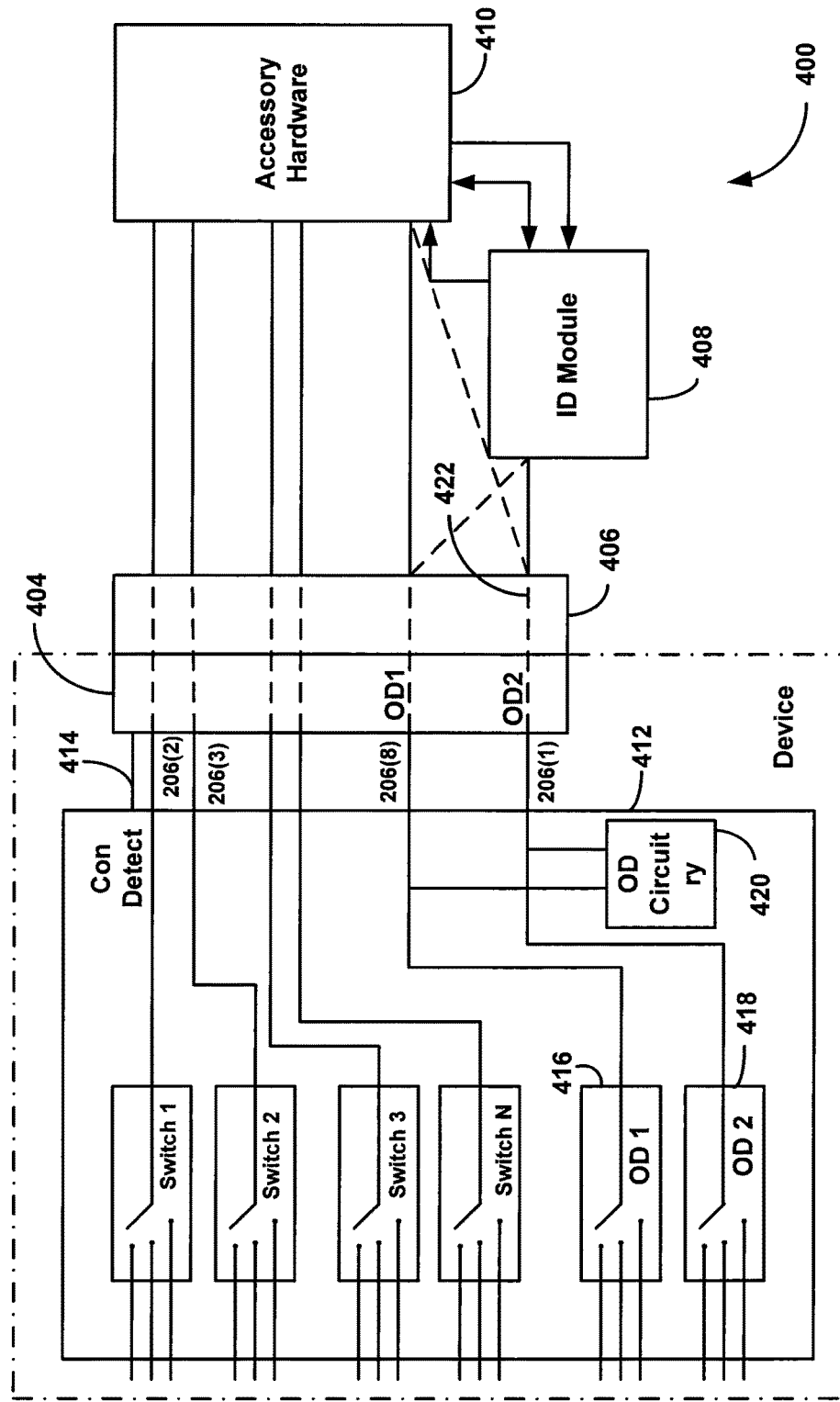
FIG. 4 is a schematic illustrating a system for determining orientation of one connector with respect to another connector according to an embodiment of the present invention.

In the particular embodiment illustrated in FIG. 2D, receptacle connector 250 has eight contacts $206_{(1)}$-$(8)$ in addition to two connection detection contacts $208_{(1)}$ and $208_{(2)}$. The operation of the connection detection contacts $208_{(1)}$ and $208_{(2)}$ is described above in relation to FIG. 2B. Some or all of contacts $206_{(1)}$-$(8)$ may have an associated switch that can configure the contact to carry one of many possible signals, e.g., as illustrated in FIG. 4. However, for ease of explanation only one switch 220 coupled to contact $206_{(8)}$ is illustrated in FIG. 2D. It is to be noted that some other contacts from among contacts $206_{(1)}$-$206_{(8)}$ may each have a similar switch 220 coupled to it. As illustrated in FIG. 2D, switch 220 can be used to configure contact $206_{(8)}$ to carry any one of signals $S_1$-$S_n$ depending on the configuration of the plug connector.

In a particular embodiment, contact $206_{(1)}$ may be an identification bus pin (ACC_ID) and can be configured to communicate a command operable to cause an accessory to perform a function and provide a response to a host device unique to the command. The command may be any one or more of a variety of commands, including a request to identify a connector pin and select one of a plurality of communication protocols for communicating over the identified connector pin, a request to set a state of the accessory, and a request to get a state of the accessory. Contact $206_{(1)}$ may also or alternatively be configured to communicate power from the host device to the accessory (e.g., Acc_Pwr). For example, contact $206_{(1)}$ may be coupled to a positive (or negative) voltage source within the host device so as to generate a voltage differential with another contact (such as a ground contact which may be, e.g., contact $206_{(8)}$).

In a particular embodiment, contacts $206_{(2)}$ and $206_{(3)}$ may form a first pair of data contact (DP1/DN1). The data contacts may be configured to carry one or more of a variety of signals, such as (a) USB differential data signals, (b) non-USB differential data signal, (c) UART transmit signal, (d) UART receive signal, (e) digital debug input/output signals, (f) a debug clock signal, (g) audio signals, (h) video signals, etc.

In a particular embodiment, contact $206_{(4)}$ may carry incoming power (e.g., a positive voltage relative to another contact such as a ground pin) to the host device (e.g., from a power source in or coupled to the accessory) with which receptacle connector 200 is associated. Contact $206_{(5)}$ may also function as an identification bus pin (ACC_ID) similar to contact $206_{(1)}$ described above. Contact $206_{(5)}$ may also or alternatively be configured to communicate power from the host device to the accessory (e.g., Acc_Pwr), depending on the orientation of a connected plug connector 100 (or connector 101) with respect to receptacle connector 200.

In a particular embodiment, contacts $206_{(6)}$ and $206_{(7)}$ may form a second pair of data pins (DP2/DN2) and can each be configured to carry one or more of a variety of signals, such as (a) USB differential data signals, (b) non-USB differential data signal, (c) UART transmit signal, (d) UART receive signal, (e) digital debug input/output signals, (f) a debug clock signal, (g) audio signals, (h) video signals, etc.

In a particular embodiment, contact $206_{(8)}$ may be a ground pin or otherwise provided at a voltage potential lower than contacts $206_{(1)}$, $206_{(4)}$, and $206_{(5)}$ so as to provide a voltage potential for power being provided to or from the host device.

Figure 3A:
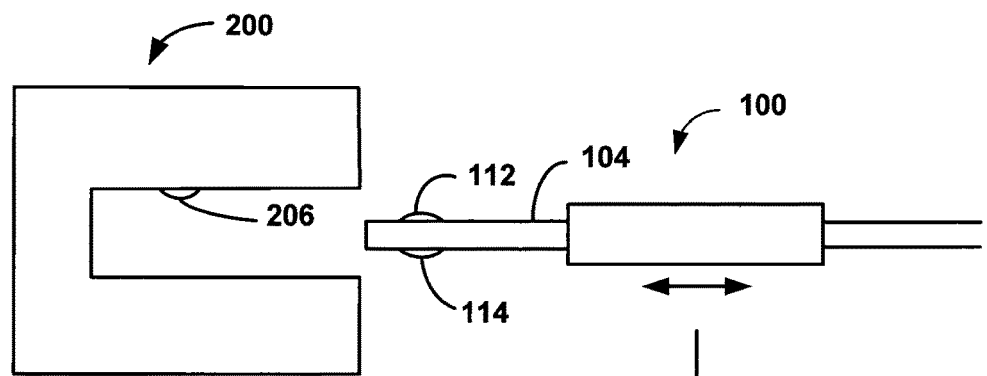
FIG. 3A is a schematic illustrating the plug connector being coupled to the receptacle connector in a first orientation according to an embodiment of the present invention.
Figure 3B:
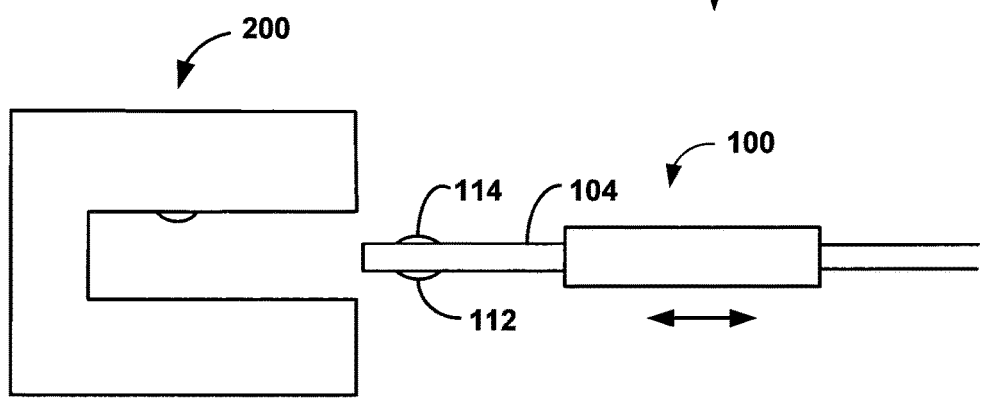
FIG. 3B is a schematic illustrating the plug connector being coupled to the receptacle connector in a second orientation according to an embodiment of the present invention.

In some embodiments, tab 104 has a 180 degree symmetrical, double orientation design which enables plug connector 100 (or connector 101) to be inserted into receptacle 200 in both a first orientation and a second orientation. FIGS. 3A and 3B are schematic views illustrating the different orientations that connector 100 (or connector 101) can be mated with connector 200. As illustrated in FIG. 3A, connector 100 (or connector 101) can be mated with connector 200 where contacts 112 of connector 100 (or connector 101) can couple with contacts 206 of connector 200. We can refer to this as the first orientation for purposes of explanation. Details of several particular embodiments of connector 100 (and connector 101) are described in a commonly-owned U.S. patent application Ser. No. 13/607, 366, filed on Sep. 7, 2012 the contents of which are incorporated by reference herein in their entirety for all purposes.

FIGS. 2E and 2F illustrate pin-out configuration for a receptacle connector according to two different embodiments of the present invention. In one embodiment, receptacle connector 200 has a pin-out as shown in FIG. 2E that matches pin-out of connector 100 in FIG. 1D and in another embodiment receptacle connector 200 has a pin-out as shown in FIG. 2F that matches pin-out of connector 101 of FIG. 1E. In each of FIGS. 2E and 2F, the ACC1 and ACC2 pins are configured to mate with either the accessory power (ACC_PWR) or accessory ID (ACC_ID) pins of the plug connector depending on the insertion orientation of plug connector, the pair of Data A contacts is configured to mate with either the pair of Data 1 contacts or the pair of Data 2 contacts of the plug connector, and the P_IN (power in) pin or pins are configured to mate with the Host Power contact or contacts of the plug connector. Additionally, in the pin-out of FIG. 2F, the GND contact is configured to mate with the GND contact in the plug connector.

In some embodiments, connector 100 (or connector 101) can be mated with connector 200 in a second orientation as illustrated in FIG. 3B. In the second orientation, contacts 114 of connector 100 (or connector 101) are coupled with contacts 206 of connector 200. As illustrated in FIGS. 3A and 3B, the second orientation may be 180 degrees rotated from the first orientation. However, these are not the only possible orientations. For example, if connector 100 (or connector 101) is a square connector with a corresponding square connector 200, then connector 100 (or connector 101) can be mated with connector 200 in one of four possible orientations. Thus, one skilled in the art will realize that more than two orientations for the connectors may be possible.

FIG. 4 is a block diagram of a system 400 according to an embodiment of the present invention. System 400 includes an electronic device/host device 402. Host device 402 can be a PC, a PDA, a mobile computing device, a media player, a portable communication device, a laptop computer, a tablet computer, or the like. Host device 402 may include a microcontroller 412 and a connector 404 that is coupled to microcontroller 402. Connector 404 can be implemented, e.g., as connector 200 of FIG. 2A. It is to be noted that host device 402 may include other components in addition to microcontroller 412. However the additional components are omitted here for the sake of clarity as they do not directly pertain to the embodiments described herein.

Microcontroller 412 can be implemented using one or more integrated circuits, one or more single-core or dual-core processors, or the like. In some embodiments, microcontroller 412 can include orientation detection circuitry 420 for detecting orientation of a accessory-side connector coupled to connector 404.

Connector 404 can be implemented, e.g., as connector 200 of FIG. 2A. Connector 404 may have multiple contacts $206_{(1)}$-$206_{(N)}$. Some of the contacts of connector 404 may be capable of being assigned one of several functions based on several factors including but not limited to the orientation in which connector 406 is mated with connector 404. In other words, contacts of connector 404 can be multiplexed to perform several different functions. Each of the contacts in connector 404 is electrically coupled to some circuitry disposed in device 402. As illustrated in FIG. 4, several of the contacts of connector 404 are coupled to switches 1-N. In some embodiments, depending on the detected orientation, switches 1-N may configure these contacts to perform one of several functions. For example, the functions may include differential data signals, USB power and/or data, UART transmit and/or receive, test ports, debug ports, operational power, etc. Each switch may be used to configure its associated contact to carry one of many available signals. The configuration of the plug connector 406 discussed below.

System 400 also includes connector 406, which can be a corresponding connector that mates with connector 404. For example, if connector 404 is a receptacle connector, the connector 406 may be a corresponding plug connector. In some embodiments, connector 406 may be implemented, e.g., as connector 100 (or connector 101) described above. Connector 406 may be associated with an accessory that is designed to be used with device 402. Connector 406 may also has several contacts. When connector 406 is physically mated with connector 404, at least one set contacts of connector 406 are physically and electrically connected to the contacts in connector 404. This results in the electrical coupling of the contacts in connector 406 with device 402 via connector 404. As discussed above, since connector 406 is reversible, either the contacts $112_{(1)}$ to $112_{(N)}$ are in electrical connection with contacts $206_{(1)}$-$206_{(N)}$ of connector 404 or contacts $114_{(1)}$ to $114_{(N)}$ are in electrical connection with contacts $206_{(1)}$-$206_{(N)}$ of connector 404. However device 402 may not know which set of contacts of connector 406 are coupled to contacts in connector 404. For a given accessory, each contact of associated connector 406 may have a predefined function associated with it. As described above, the type of signals carried by connector 406 may depend on the type of accessory that it is associated with. For example, if connector 406 is associated with a charge/sync cable, the contacts of connector 406 may carry at least a power signal and a communication signal, among others. Thus, at the time connector 406 is mated with connector 404, the information carried by each contact in connector 406 may be pre-defined. This information may be transmitted to host device 402 so that host device 402 can configure contacts $206_{(1)}$-$206_{(N)}$ of connector 404 appropriately. Accordingly, before a mating event between connectors 404 and 406, contacts of connector 404 are placed in a "floating" mode. In other words contacts of connector 404 are isolated from other circuitry within host device 402.

Thus, before contacts $206_{(1)}$-$206_{(N)}$ of connector 404 can be configured; it may be beneficial to understand the orientation of connector 406 with respect to connector 404. In other words, it would be beneficial to understand which of the two sets of contacts, e.g., $112_{(1)}$ to $112_{(N)}$ or $114_{(1)}$ to $114_{(N)}$, of connector 406 are currently coupled to contacts $206_{(1)}$-$206_{(N)}$ of connector 404. In order to determine this, a process referred to herein as orientation detection may be performed.

However, before the orientation detection process can begin, device 402 may ensure that connector 406 is mated securely with connector 404, i.e. at least some contacts in both connectors are in physical contact with each other. This is done to ensure that the two connectors are properly mated and that there is reduced risk of arcing or shorting due to a potentially floating, partially connected, or unconnected power contact. In order to determine physical mating between connectors 404 and 406, a process referred to herein as connection detection may be performed.

Before the host device can initiate communication with an accessory, it may be beneficial to determine whether the plug and the receptacle connectors are physically connected or "mated" with each other. As described above, a receptacle connector, e.g., connector 404, has a connection detection contact, e.g., contact $208_{(1)}$ illustrated in FIG. 2B, which is recessed from the other contacts in the receptacle connector. This connection detection contact, labeled as "Con Detect" in FIG. 4, is a last make/first break type of contact. In other words, as plug connector 406 is mated with receptacle connector 404, the connection detection contact is the last contact in connector 404 to make physical contact with any portion of connector 406. During an un-mating sequence, this connection detection contact is the first contact in connector 404 to physically disengage from connector 406. In some embodiments, the connection detection contact is coupled to microcontroller 412 via a signal line 414. When connector 406 is not mated with connector 404, signal line 414 is held in a logic "high" state by microcontroller 412. Thus, as long as signal line 414 is in a logic "high" state, the host device may conclude that no connector has been mated with connector 404.

When connector 406 is mated with connector 404, a certain distance after travelling within the cavity of connector 406, a ground ring, e.g., cap 120 of FIG. 1, of connector 406 makes physical contact with the connection detection connector. This causes signal line 414 to transition from the logic "high" state to a logic "low" state. Microcontroller 412 can detect this change in state of signal line 414 and determine that connector 406 is now physically connected with connector 404. In some embodiments, based on the physical design of the two connectors, when signal line 414 goes into the logic "low" state, it can be concluded that other contacts in the plug connector are also in physical connection with corresponding contacts in the receptacle connector. In some embodiments, the detection of this mating triggers further processes such as orientation detection, accessory authentication, contact configuration, etc. as described below.

In some embodiments, the connection detection contact can also be used for disconnection detection. In some embodiments, in order to protect device 402 from unauthorized accessories that may cause harm, all the switches within device 402, e.g., Switches 1-N and the OD1 and OD2 switches, are held in an open state prior to detection of a connection event. Similarly it would be desirable that once connector 406 is disconnected, these switches are returned to their "open" state so that no harmful signals can be communicated to device 402.

When connector 406 is un-mated or disconnected from connector 404, the connection detection contact is the first contact that loses physical connection with connector 406 (recall this is a last make/first break type contact). Once the connection detection contact becomes physically disengaged from connector 406, signal line 414 returns to its logic "high" state. Microcontroller 412 can detect this change in state and conclude that connector 406 has been disengaged from connector 404. Based on this determination, microcontroller may operate one or more of the switches to place them in an "open" state thus protecting the internal circuitry of device 402 from potential arcing and shorting hazard if any of the corresponding contacts of the plug connector have power on them.

At a later time if connector 406 is once again mated to connector 404, device 402 may again perform the connection detection process described above.

As described above, in some embodiments, the accessory-side connector, e.g., connector 406, can be mated with the host-side connector, e.g., connector 404 in more than one orientation. In such an instance, it may be desirable to determine the orientation of the accessory-side connector with respect to the host-side connector in order to properly route signals between the host device and the accessory.

In some embodiments, one or more of the contacts in connector 404 may be used for determining orientation. As described earlier, all switches inside microcontroller 412 that control the respective contacts of connector 404 are initially in an "open" state. In the embodiment of FIG. 4, two contacts, illustrated as OD1 and OD2, can be used to determine orientation. In order to describe the orientation detection and contact configuration processes, consider for example that contacts $206_{(1)}$ (designated as "OD2" in FIG. 4) and $206_{(8)}$ (designated as "OD1" in FIG. 4) can be chosen from among contacts $206_{(1)}$-$206_{(N)}$ of connector 404. Each of these contacts OD1 and OD2 are connected to corresponding switches 416 and 418, respectively. It is to be understood that any other contacts from connector 404 may also be chosen and contacts $206_{(1)}$ and $206_{(1)}$ are merely being used herein to explain the techniques. Similar to the contacts $206_{(1)}$-$206_{(N)}$, contacts OD1 and OD2 can also be configured to perform one of several functions. In some embodiments, contacts OD1 and OD2 may be first used to detect orientation and then later may be configured to perform certain other functions once the orientation detection is complete, e.g., carry communication signals between the accessory and the host device and/or carry accessory power from the host device to the accessory. In some embodiments, contacts $206_{(1)}$-$206_{(N)}$ in connector 404 may be floating prior to the completion of the orientation detection process. "Floating" in this context means that the contacts $206_{(1)}$-$206_{(N)}$ may not be assigned any function prior to the orientation detection and are in an deactivated or isolated state. This may be accomplished by having one or more of switches 1-N in an "open" state.

In some embodiments, orientation detection circuitry 420 may be coupled to contacts OD1 and OD2 and can monitor contacts OD1 and OD2 to detect presence of a particular or expected signal on either of the contacts. Orientation detection circuitry 420 can send a command over any of the contacts OD1 and OD2 and detect a response to the command. This will be explained in detail below.

In some embodiments, system 400 may include an ID module 408. ID module 408 may be implemented as an Application Specific Integrated Circuit (ASIC) chip programmed to perform a specific function, e.g., as one of chips 113a or 113b of FIG. 1A. In some embodiments, ID module 408 may be disposed in the accessory that connects with host device 402. In other embodiments, ID module 408 may be an integral part of connector 406 and may be disposed within a housing of connector 406, e.g., as illustrated in FIG. 1A. In some embodiments, ID module 408 may receive a command from host device 402 via contact OD2 and may respond with a predetermined response to the command over the same contact OD2. In some embodiments, ID module 408 is closely integrated with connector 406. In other words, ID module 408 and connector 406 may be disposed in an accessory that is configured to be operable with device 402. Thus, in an instance where the accessory is a cable, connector 406 and ID module 408 can be part of the cable. In some embodiments, ID module 408 may include configuration information associated with the contacts of connector 406 with which it is associated. Upon successful connection with host device 402, ID module 408 may provide the configuration information to host device 402 as described below.

In some embodiments, system 400 may also include accessory hardware 410. Accessory hardware 410 can be a processor and other associated circuitry of an accessory that is designed to be operable with device 402. In some embodiments, an accessory may provide power to device 402 and in other embodiments; the accessory may be powered by device 402. Accessory hardware 410 will vary depending on type and function of the accessory.

It will be appreciated that the system configurations and components described herein are illustrative and that variations and modifications are possible. The device and/or accessory may have other components not specifically described herein. Further, while the device and the accessory are described herein with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of devices including electronic devices implemented using any combination of circuitry and software.

In operation, in an embodiment of the present invention, when connector 406 is physically mated with connector 406, signal line 414 changes its state from logic "high" to logic "low" when the connection detection contact of connector 404 makes physical contact with the ground ring portion of connector 406. This indicates to device 402 that connector 406 is now connected to connector 404. Thereafter, microcontroller 412 initiates the orientation detection operation.

Connector 406 is configured such that one contact within connector 406 carries an identification signal, e.g., ID contact 422 which may correspond to one of contacts OD1 or OD2 described above. Once the contact carrying the accessory identification signal is identified, device 402 can determine an orientation of connector 406 with respect to connector 404. As described above in relation to FIGS. 3A and 3B, connector 406 can be mated with connector 404 in more than one orientation. As also as described above, in order to illustrate the orientation detection process, we considered that either contact OD1 or OD2 of connector 404 is connected with ID contact 422 of connector 406. Thus, in one orientation, ID contact 422 can be connected to contact OD2 of connector 404 and in a second orientation, which is 180 degrees from the first orientation; ID contact 422 can be connected to contact OD2 of connector 404. In order to determine which of contacts OD1 or OD2 is connected to ID contact 422, the following process may be used.

Once it is determined that connector 406 is mated with connector 404, one of the switches 416 or switch 418 is closed so that the contact corresponding to the closed switch is now "active." In other words, the contact associated with the closed switch is now in electrical connection with corresponding contact in connector 406. As described above, both switches 416 and 418 are in an "open" state when connector 404 and connector 406 are first mated with each other. Consider that switch 416 is closed first. In this instance, switch 418 is kept open to avoid any power or other harmful signal from appearing on the associated OD2 contact. In the instance illustrated in FIG. 4, closing switch 416 results in the contact OD1 being electrically coupled to accessory power line via connector 406. It is to be understood the contact OD1 may also have been connected to ID module 408 depending on which orientation connector 406 was connected to connector 404 (as shown by dotted line in FIG. 4). However, to explain the orientation detection process, FIG. 4 assumes that contact OD1 is connected to accessory power line while contact OD2 is connected to ID module 408.

Once switch 416 is closed, microcontroller 412 sends a command over the OD1 contact, e.g., using OD circuitry 420. OD circuitry 420 then "listens" for a specific and/or expected response to the command on the OD1 contact. In some embodiments, the command is interpretable only by ID module 408, which in turn generates a response to the command. However, in this example, the OD1 contact is coupled to the accessory power line and not to ID module 408. Therefore, ID module 408 does not receive the command and thus does not generate a response to the command. Consequently, no response to the command is received by OD circuitry 420 via the OD1 contact.

If after a predetermined time OD circuitry 420 does not detect a response on the OD1 contact, microcontroller 412 concludes the OD1 contact is not connected to ID module 408 on the accessory side and opens switch 416. Thereafter, microcontroller 412 closes switch 418. This causes contact OD2 to be now electrically connected to ID module 408 via ID contact 422. Thereafter, OD circuitry 420 sends the same command as above over the OD2 contact. Because the OD2 contact is connected to ID module 408, once ID module 408 receives the command, it generates and sends a response over the OD2 contact to microcontroller 412. The response is detected by OD circuitry 420. Thus, microcontroller 412 now knows that the OD2 contact is connected to ID module 408 and designates the line that is coupled to the OD2 contact as the accessory communication line (e.g., ACC_ID of FIG. 1E). Thus, in our example, one of contacts $206_{(1)}$ or 206$_{(8)}$ now carries the accessory communication signal and the other contact can be designated as the accessory power contact (e.g., ACC_PWR of FIG. 1E). Based on the location/position of the accessory communication contact and the accessory power contact, host device 402 can now determine the orientation of the connector 406 with respect to connector 404.

Figure 5:
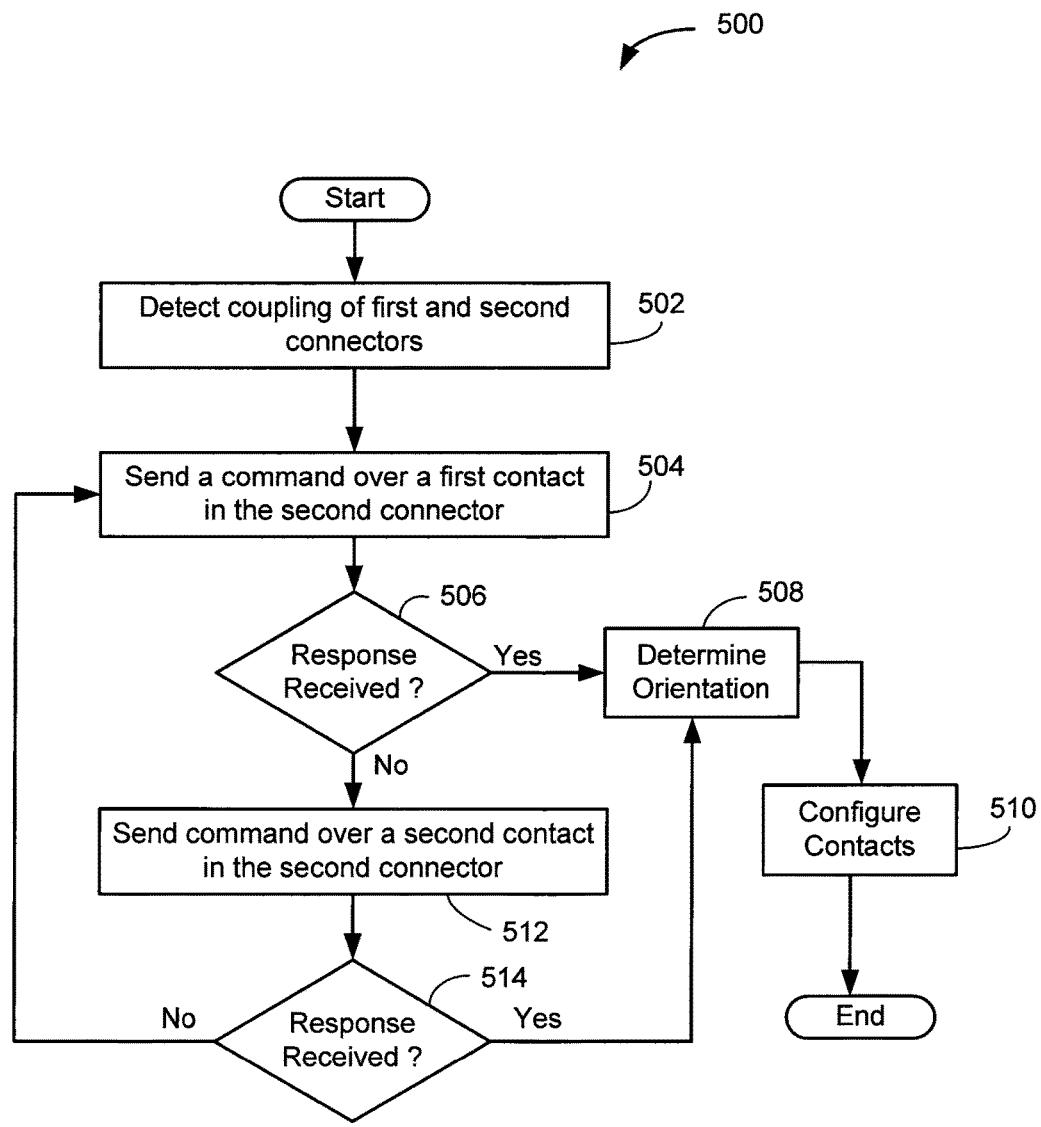
FIG. 5 is a flow diagram of a process for determining orientation of one connector with respect to other according to an embodiment of the present invention.

FIG. 5 is a flow diagram of a process 500 for determining orientation of an accessory-side connector with respect to a host-side connector according to an embodiment of the present invention. Process 500 may be performed, e.g., by host device 402 of FIG. 4.

At block 502, the host device may detect coupling of the accessory (first) connector with its own (second) connector. In other words, the host device may detect that the accessory connector has been physically coupled to its own connector, e.g., via the connector detector contact in its connector. Once the host device determines that the accessory connector is physically coupled to its connector, the host device may, via the microcontroller, send a command over a first contact, e.g., OD1 of FIG. 4, of its connector, e.g., the OD1 contact described above at block 504. For example, the host device may send the ID command described below in reference to FIG. 7A. Once the command is sent, the host device may wait for a response to the command from the accessory. At block 506, the host device may check whether a response to the command was received from the accessory over the first contact. If a response is received over the first contact, the host device may determine the orientation of the accessory connector with respect to its own connector at block 508. For instance, based on the response, the host device now knows which contact in its own connector is coupled to the ID module in the accessory-side connector and can therefore designate that contact as the ID bus line or accessory communication line. Once the ID bus line/contact is known, the host device can determine the orientation in which the accessory connector is plugged in. Once the orientation is known, the host device may configure the rest of the contacts of the second connector based on the determined orientation, at block 510.

If at block 506, the host device receives no response to the command, the host device can send the same command over a second contact, e.g., OD2 of FIG. 4, in its connector at block 512. At block 514, the host device can again check to see if a valid response is received from the ID module for the command over the second contact. If a valid response is received, process 500 proceeds to blocks 508 and 510 as described above and the host device configures the rest of the contacts in its own (second) connector accordingly. If no response is received at block 514, the process returns to block 504 where the host device sends the same command over the first contact again. Thus, the host device may alternately send the command over the first and the second contacts until it receives a valid response on one of the contacts. In some embodiments, process 500 may be programmed to time out after a certain duration or after a certain number of attempts.

It should be appreciated that the specific steps illustrated in FIG. 5 provides a particular method of determining orientation according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. In particular, several steps may be omitted in some embodiments. One of ordinary skill in the art would recognize many variations, modifications, and alternatives.

Certain embodiments of the present invention provide techniques for dynamically configuring contacts of a host-side connector. The configuring of the contacts may be done without first determining orientation of the accessory-side connector. In some embodiments, the host device may send a command to the accessory, as described above. The response to the command may include information about the contact assignment/configuration for the accessory-side connector. The accessory may provide this contact assignment information to the host device in a response packet similar to the one described below. Details of the command and response are described below in connection with FIGS. 7A and 7B. In addition to the contact configuration information, the accessory, e.g., via ID module 408, may also send configuration information of the accessory, an accessory identifier, etc. to the host device.

In some embodiments, the accessory configuration information may also include type of accessory, types of signals provided/required by the accessory, etc. among other things. For example, the accessory may provide information about the signal that each contact of connector 406 is configured to carry. For example, a first contact may carry a power signal; a second contact may carry a data signal, etc. Once the microcontroller 412 receives this contact configuration information from the accessory, it can operate switches 1-N associated with the corresponding contacts in connector 404 to configure the contacts to carry the same signals as the corresponding contacts in connector 406.

It is to be noted that contact configuration in the host device can occur independent of orientation detection for the accessory-side connector. For example, accessory-side connector, e.g., connector 406, can only be connected to connector 404 in a single orientation. In this instance there is no need for determining orientation of connector 406 with respect to connector 404. Upon connection, the accessory can send contact configuration information for connector 406 to the host device. The host device can then configure the contacts of its own connector 404 to match those of connector 406. Thus, in some embodiments, contact configuration may be performed without first performing orientation detection.

Once the contacts in connector 404 are configured properly, a continuous electrical link is established between device 402 and the accessory and device 402 can then communicate with the accessory in a substantive manner, e.g., exchange commands and data, run application programs, etc.

Figure 6:
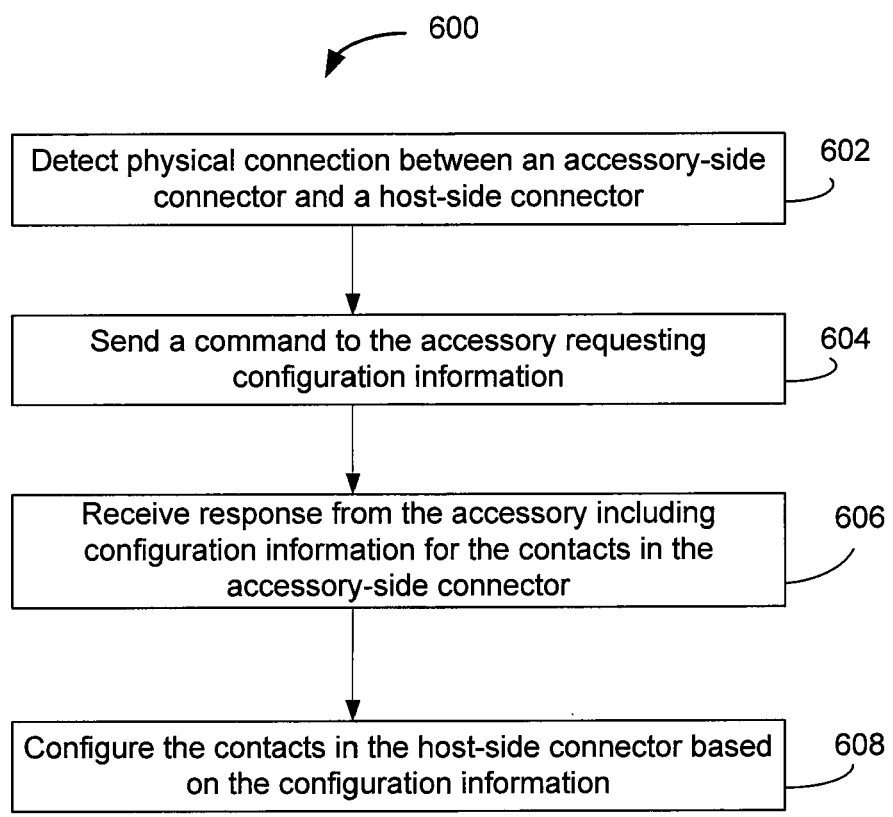
FIG. 6 is a flow diagram of a process for configuring contacts of a connector according to an embodiment of the present invention.

FIG. 6 is a flow diagram of a process 600 for configuring contacts of a connector according to an embodiment of the present invention. Process 600 can be performed, e.g., by device 402 of FIG. 4.

The host device initially detects physical connection between the host-side connector and the accessory-side connector (block 602). In an embodiment, the host device may use the connection detection contact described above to determine the physical connection. Once the two connectors are physically connected, the host device may send a command to the accessory to provide configuration information about the contacts on the accessory-side connector (block 604). In some embodiments, the host device need not even request this information and the accessory may automatically provide this information upon determination of physical connection between the two connectors. The host device receives the contact configuration information from the accessory (block 606). The contact configuration information enables the host device to determine the functionality associated with each contact in the accessory-side connector. Based on this information, the host device configures contacts in the host-side connector to match the functionality of the corresponding accessory-side connector contacts (block 608). In some embodiments, the host device may operate switches 1-N illustrated in FIG. 4 to impart the appropriate functionality to some of the contacts in the host-side connector.

In some embodiments, the accessory may not even send the contact configuration information to the host device. Instead the host device may determine the type of accessory connected to it based on, e.g., an accessory identifier. Once the type of accessory is determined, the host system may consult a look-up table in order to determine contact configuration of the accessory-side connector and accordingly configure the contacts of the host-side connector. In this instance, the look-up table may include contact configuration information for various accessory-side connectors that may be indexed using a unique accessory identifier associated with each accessory.

It should be appreciated that the specific steps illustrated in FIG. 6 provides a particular method for configuring contacts according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. In particular, several steps may be omitted in some embodiments. One of ordinary skill in the art would recognize many variations, modifications, and alternatives.

In some embodiments, the configuration of the accessory-side contacts may be changed by the accessory after providing an initial configuration information. This may happen in instances where the accessory is capable of performing two different functions, e.g., USB and UART. Initially, the accessory may specify the accessory-side connector contacts as being configured for USB signals and communicate that information to the host. The host may then configure the contacts of its host-side connector to match the accessory-side connector contacts. Then during operation, consider that the accessory changes the accessory-side connector contacts to now carry UART signals. In this instance, the accessory can send new configuration information to the host device and the host device can dynamically change the configuration of the host-side connector contacts to match the new configuration.

Figure 7A:
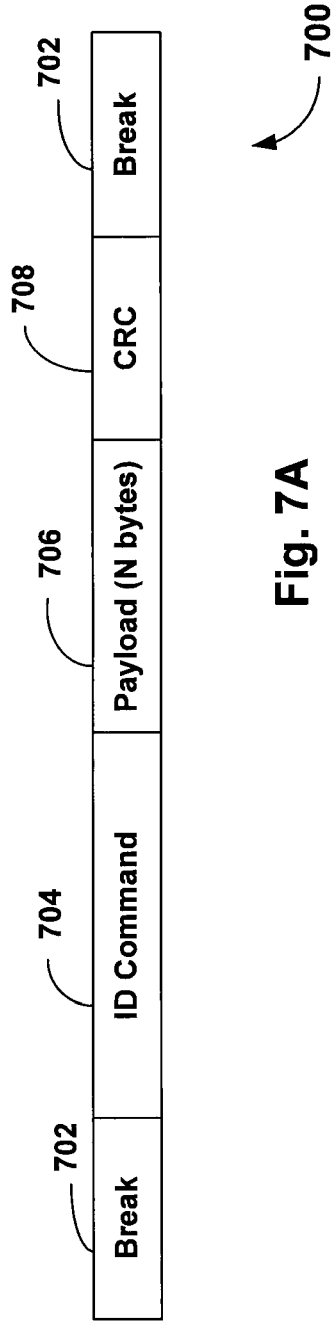
FIG. 7A illustrates a command structure according to an embodiment of the present invention.
Figure 7B:
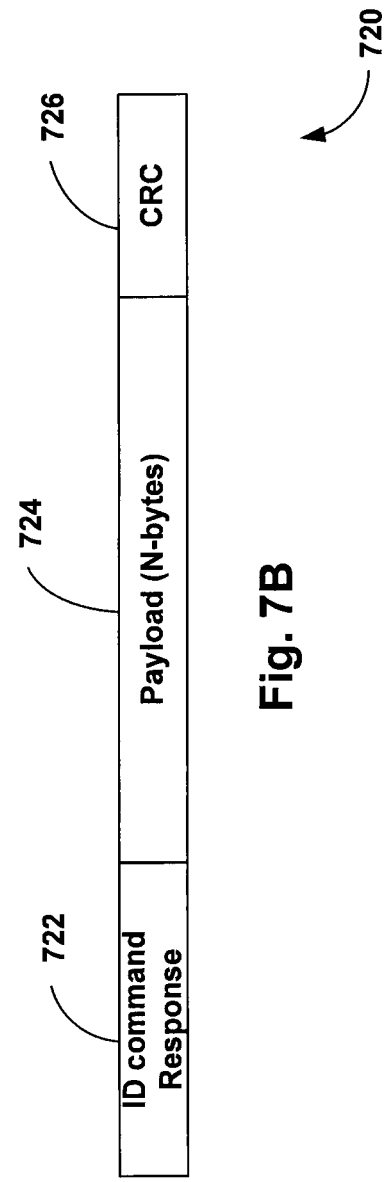
FIG. 7B illustrates a response structure for the command according to an embodiment of the present invention.

As described above, when the ID module receives a command from the microcontroller, it sends a predetermined response back to the microcontroller. FIGS. 7A and 7B illustrate a command and response sequence according to an embodiment of the present invention.

FIG. 7A illustrates a structure for a command sequence 700 that can be sent by the microcontroller over the OD1 or the OD2 lines according to an embodiment of the present invention. Command sequence 700 may include a break pulse 702. In some embodiments, break pulse 702 may be used to indicate to the ID module that a command is being sent by the microcontroller and/or to indicate start of a command. In some embodiments, the duration of break pulse may be programmable. In some embodiments, break pulse 702 resets the ID module to a known state so that the ID module is ready to receive the command from the microcontroller. Break pulse 702 may be followed by a command 704. In some embodiments, command 704 can include between 8 and 16 bits. In some embodiments, command 704 can be followed by a N-byte payload 706. In other embodiments, command 704 can be sent without any payload. For the purposes of detecting orientation, command 704 can be followed by up to 16 bits of payload 706. In this instance, payload 706 may include a unique identifier associated with the microcontroller. The unique identifier can be used by the ID module to recognize the microcontroller and/or the device and formulate a response to command 704. For example, the unique identifier may inform the ID module whether the device is phone, a media player, or a personal computing device, e.g., a tablet computer, or a debug accessory.

In some embodiments, payload 706 (or command 704) may be followed by Cyclic Redundancy Check (CRC) sequence 708. CRC is an error-detecting code designed to detect accidental changes to raw computer data, and is commonly used in digital networks and storage devices. Blocks of data entering these systems get a short check value attached, derived from the remainder of a polynomial division of their contents; on retrieval the calculation is repeated, and corrective action can be taken against presumed data corruption if the check values do not match. In some embodiments, CRC sequence 708 can be generated using a 8 polynomial function of $X^8+X^7+X^4+1$. In some embodiments, CRC 708 may be followed by another break pulse 702 signaling end of the command sequence. This indicates to the ID module that the microcontroller has finish sending the command and associated data, if any, and is now ready to receive a response. It is to be understood that only the ID module can interpret and respond to this command. Thus, if command sequence 700 is sent over a line that is not connected to the ID module, the microcontroller in the host device will not receive a response to the command. In some embodiments, the command may time-out if a response is not received from the host device. In this instance, the microcontroller will conclude that the line is not connected to the ID module and hence is not the ID bus line.

One skilled in the art will realize the command sequence 700 is illustrative only and may include more or less information than shown in FIG. 7A depending on the specific requirements for communication between the device and the accessory that includes the ID module.

Once the ID module receives command sequence 700, it may send a response sequence 720 as illustrated in FIG. 7B. Response sequence 720 may include a command response 722. Command response 722 may be a predetermined response for command 704. For example, regardless of the type of device connected, each ID module may generate the same command response 722 in response to receiving command 704 from the device. Response sequence 720 may also include payload 724, which may be up to 48-bits long. In some embodiments, payload 724 may include an identifier associated with the accessory incorporating the ID module, e.g., a serial number of the accessory. In some embodiments, payload 724 may also include configuration information associated with the accessory such as type of accessory, various signals needed by the accessory in order to communicate with the device, etc. In some embodiments, payload 724 may include information about functionality associated with each if the contacts in the accessory-side connector. For example, up to 4 bits may be used to indicate functionality to be imparted to the OD1 and OD2 switches.

In some embodiments, up to 2 pairs of 2-bits each in payload 724 may inform the microcontroller on how to configure the switches 1-N, where N=4 or in other words which functionality is to be imparted to the contacts associated with switches 1-N. Once configured, the switches connect the various contacts in connector 404 to other circuitry within device 402. It is to be understood that additional bits may be used for additional switches and the system is expandable. Thus, upon receiving the command response, the microcontroller now knows how to configure the various switches 1-N, OD1, and OD2 described above. In some embodiments, payload 724 may be followed by CRC 726. CRC 726 may be similar to CRC 708. In some embodiments, the total duration for sending command sequence 700 and receiving response sequence 720 is about 3 milliseconds. Details of the command and response structure and their contents is described in a co-pending U.S. patent application Ser. No. 13/607,426, filed on Sep. 7, 2012, the contents of which are incorporated by reference herein in its entirety for all purposes.

Referring back to FIG. 4, in some embodiments, if connector 406 is physically removed/detached from connector 404, device 402 detects the removal via connector detect 414 and as a result, microcontroller 412 places all the switches 1-N in an 'open' state. For example, if a logic "high" is detected on signal line 414 for longer than a predetermined duration, the microcontroller can conclude that connector 406 has been detached from connector 404 and may instruct device 402 accordingly. In some embodiments, the predetermined duration is between 20 μs and 100 μs.

The embodiments described above can be independent of each other. For example, orientation detection can be performed without being followed by contact configuration. Orientation detection may be useful in instances where the contacts all have fixed functionality and it is desirable to only determine which way the accessory-side connector is connected to the host-side connector. Also, in another embodiment, contact configuration can be performed without first determining orientation of the accessory-side connector with respect to the host-side connector. For example, in some instances, the two connectors can only be mated in a single orientation. In this instance there is no need for determining orientation and upon connection the host device may configure the host-side connector contacts based on the accessory-side connector.

In yet another embodiment of the present invention, contact configuration can follow and be based on the orientation of the accessory-side connector with respect to the host-side connector. For example, in instances where two connectors can be mated with each other in more than one orientation, it may be beneficial to first determine the orientation of one connector with respect to another (e.g., using the technique described above) and then configure the contacts based on the determined orientation.

Figure 8A:
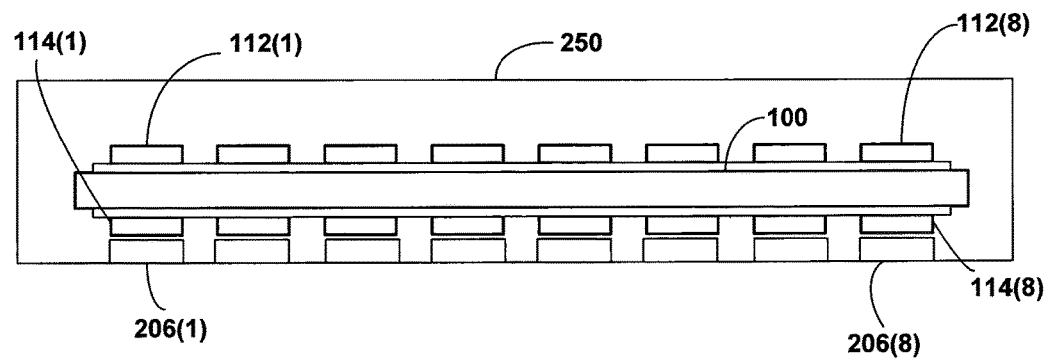
FIG. 8A is a simplified cross-sectional view of a plug connector mated with a receptacle connector in a first orientation according to an embodiment of the present invention.
Figure 8B:
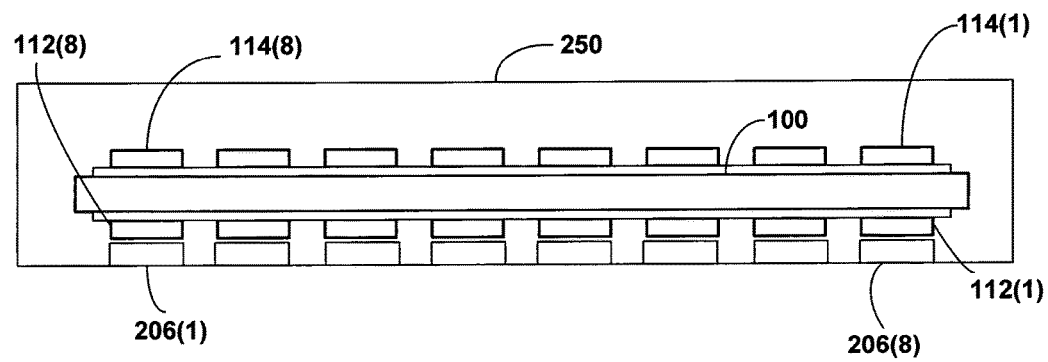
FIG. 8B is a simplified cross-sectional view of a plug connector mated with a receptacle connector in a second orientation according to an embodiment of the present invention.

FIG. 8A is a cross-sectional view illustrating an accessory-side connector 100 (or connector 101) mated with a host-side connector 250 according to an embodiment of the present invention. As illustrated in FIG. 8A, contact 114(1) of connector 100 is in contact with contact 206(1) of connector 250. Connector 100 is reversible and can be mated with connector 250 in at least two orientations. In addition to the orientation illustrated in FIG. 8A, connector 100 can also be mated with connector 250 in another orientation illustrated in FIG. 8B. In the other orientation contact 112(8) of connector 100 is in contact with contact 206(1) of connector 250. Thus, it can be seen that in the two orientations, two different contacts of connector 100 can be coupled to the same contact of connector 250. Thus, in this instance it would be beneficial to first determine which orientation connector 100 is mated before any of the contacts are configured. For example, since some of the contacts may carry power, it would be detrimental if the incorrect contact on the host-side connector is enabled to carry power.

In this embodiment, once it is determined that connector 100 is physically connected to connector 250, e.g., using the connection detection contact described above, the host device then attempts to determine in which orientation is connector 100 mated with connector 250. In other words, the host device determines which contacts of connector 100 are actually physically connected to the contacts of connector 250. Once the orientation is determined, the host device can use that information and the contact configuration information of connector 100 to configure the contacts of connector 250.

Figure 9A:
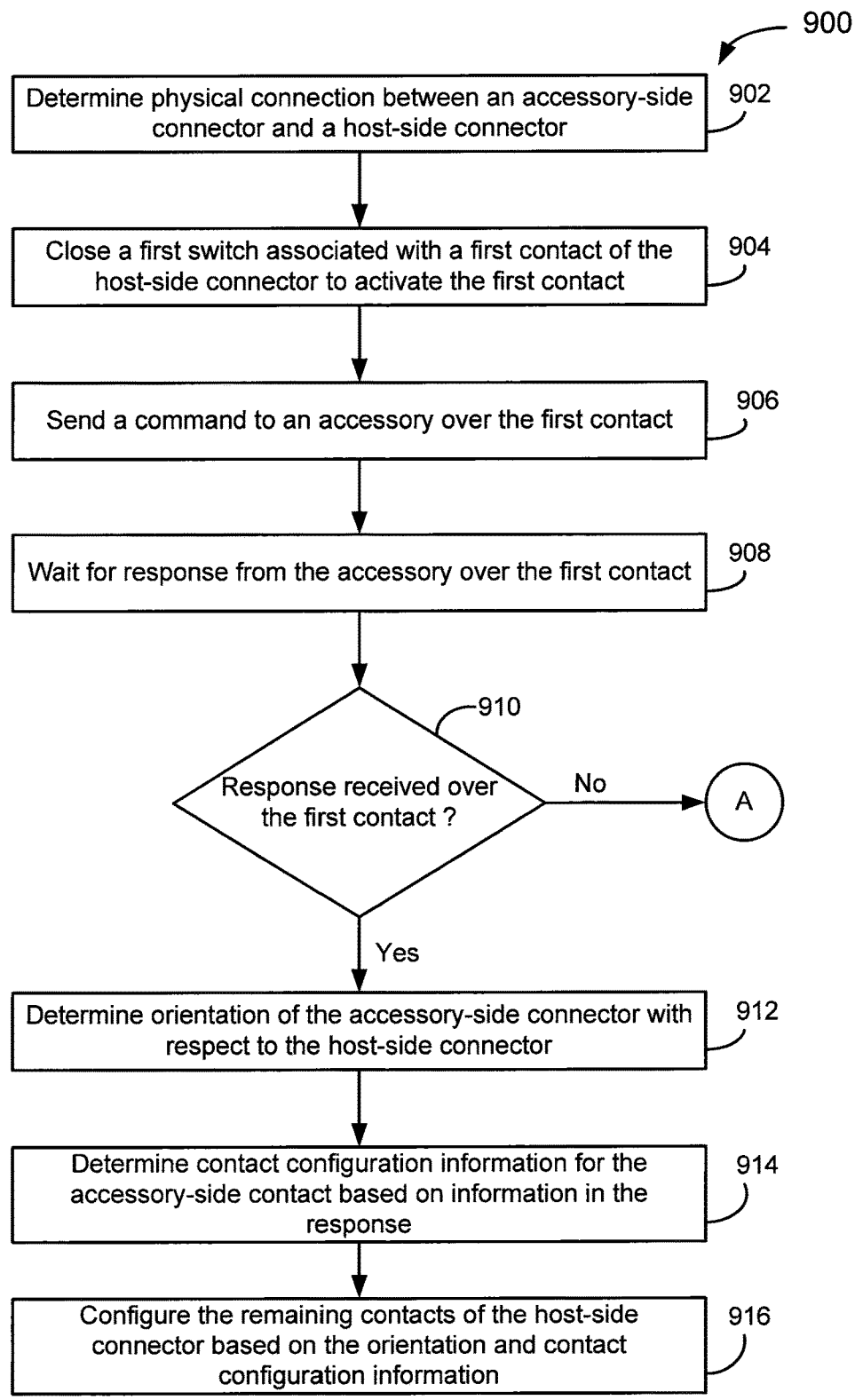
FIGS. 9A and 9B is a flow diagram of a process for determining orientation and configuring contacts of a connector based on the orientation according to another embodiment of the present invention.
Figure 9B:
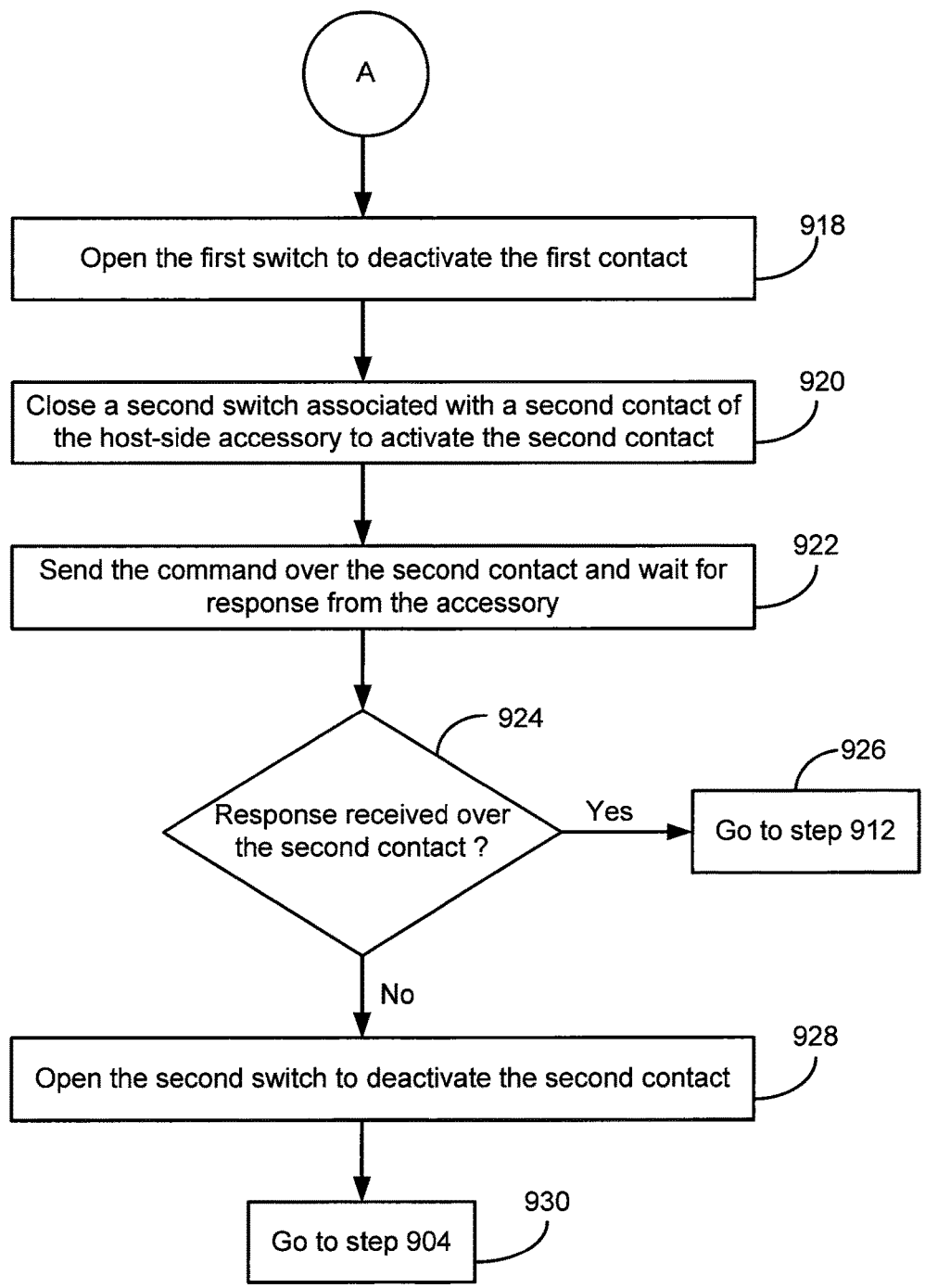

FIGS. 9A and 9B illustrate a flow diagram for a process 900 for determining orientation and configuring contacts of a connector according to an embodiment of the present invention. Process 900 may be performed by, e.g., host device 402 of FIG. 4.

As described above, when the host device is not connected to any accessory via its host-side connector, all the switches that control the contacts of the host-side connector are in an "open" state thus placing all the contacts in a deactivated/isolated state. This is done to ensure that no unwanted signal can be received by the host device thus protecting the host device from any damage. At block 902 the host device determines that an accessory-side connector has been physically mated with its host-side connector, e.g., using the connection detection contact in the host-side connector. In response to detecting physical mating of the two connectors, the host device, at block 904, closes a switch associated with a first contact of the host-side connector to be used for detecting orientation. This results in the first contact being activated or in other words a continuous connection path now exists between host device and the accessory via the first contact.

Thereafter, the host device sends a command to the accessory over the first contact at block 906. In some embodiments, the command may request certain information from the accessory. After sending the command over the first contact, the host device then waits to receive a response back from the accessory, at block 908. Thereafter the host device checks to see if a response was received from the accessory at block 910. If the host device receives a response from the accessory on the first contact, the host device designates the first contact as carrying the accessory communication signals. As described above, the command sent by the host device can only be interpreted by an ID module in the accessory or the accessory-side connector. Thus, the fact that a response was received on the first contact means that the first contact is coupled to the ID module in the accessory.

Once it is determined that the first contact is coupled to the accessory communication contact of the accessory-side connector, the host device can determine orientation of the accessory-side connector with respect to the host-side connector at block 912. In other words, the host device now knows which contacts of the accessory-side connector are in physical contact with contacts of the host-side connector. The response received from the accessory over the first contact includes information that specifies functionality associated with each of the contacts of the accessory-side connector. The host device, at block 914, can analyze the information received from the accessory and determine the function associated with each contact of the accessory-side connector. Based on this information and the previously determined orientation information the host device now knows which contacts of the host-side connector are to be assigned which function in order to be compatible with the accessory-side connector. In order to accomplish this, the host device, at block 916, operates a switch associated with one or more of the contacts of the host-side connector in order to configure the contact to enable the determined function.

However, if at block 910 the host device does not receive any response from the accessory, the host device opens the first switch and deactivates the first contact at block 918, as illustrated in FIG. 9B. Thereafter at block 920 the host device closes a second switch associated with a second contact and activates the second contact. At block 922, the host device sends the same command over the second contact and waits for a response from the accessory. If a response from the accessory is received at block 924 over the second contact, process 900 continues to step 912. If the host device does not receive a response from the host device at block 924, the host device opens the second switch and deactivates the second contact at block 928. Thereafter process 900 returns to step 904 where the first contact is again activated.

Host device may alternately activate the first contact and the second contact, send the command over the active contact, and wait for a response from the accessory. In some embodiments, the host device may repeat this process indefinitely until it receives a response from the accessory. In other embodiments, after expiration of a predetermined time duration, the host may stop process 900 and report an error. In some embodiments, the first contact and the second contact used for determining orientation are predetermined and programmed into the host device. In other embodiments, the first and/or the second contact may be dynamically selected.

It should be appreciated that the specific steps illustrated in FIGS. 9A and 9B provides a particular method for determining orientation and configuring contacts according to an embodiment of the present invention. Other sequences of steps may also be performed according to alternative embodiments. For example, alternative embodiments of the present invention may perform the steps outlined above in a different order. Moreover, the individual steps illustrated in FIGS. 9A and 9B may include multiple sub-steps that may be performed in various sequences as appropriate to the individual step. Furthermore, additional steps may be added or removed depending on the particular applications. In particular, several steps may be omitted in some embodiments. One of ordinary skill in the art would recognize many variations, modifications, and alternatives.

Circuits, logic modules, processors, and/or other components can be described herein as being "configured" to perform various operations. Those skilled in the art will recognize that, depending on implementation, such configuration can be accomplished through design, setup, interconnection, and/or programming of the particular components and that, again depending on implementation, a configured component might or might not be reconfigurable for a different operation. For example, a programmable processor can be configured by providing suitable executable code; a dedicated logic circuit can be configured by suitably connecting logic gates and other circuit elements; and so on.

While the embodiments described above can make reference to specific hardware and software components, those skilled in the art will appreciate that different combinations of hardware and/or software components can also be used and that particular operations described as being implemented in hardware might also be implemented in software or vice versa.

Computer programs incorporating various features of the present invention can be encoded on various non-transitory computer readable storage media; suitable media include magnetic disk or tape, optical storage media, such as compact disk (CD) or DVD (digital versatile disk), flash memory, and the like. Computer readable storage media encoded with the program code can be packaged with a compatible device or provided separately from other devices. In addition program code can be encoded and transmitted via wired optical, and/or wireless networks conforming to a variety of protocols, including the Internet, thereby allowing distribution, e.g., via Internet download.

Thus, although the invention has been described with respect to specific embodiments, it will be appreciated that the invention is intended to cover all modifications and equivalents within the scope of the following claims.

What is claimed is:

1. An electronic device comprising:
a first connector configured to be mated with a second connector in a second electronic device, the first connector comprising a plurality of external contacts including first and second data contacts and a third contact;
an identification module storing contact configuration information comprising a plurality of bits that identifies a first communication protocol used by the electronic device to communicate with the second electronic device over the first and second data contacts, the identification module being configured to: (i) receive a request from the second electronic device over the third contact to send contact configuration information identifying the communication protocol used on the first and second data contacts, and (ii) in response to the request, send the contact configuration information to the second electronic device over the third contact; and
first communication circuitry, coupled to the first and second data contacts, that enables the electronic device to communicate with the second electronic device using the first communication protocol over the first and second data contacts;
wherein the first connector includes a tab portion having first and second opposing exterior surfaces, a length extending in a first direction and a width extending in a second direction, the tab portion configured to be inserted into a cavity of the second connector during a mating event, and wherein the plurality of external contacts are positioned in a contact region formed at the first exterior surface of the tab portion, the contact region being fully surrounded in the first and second directions by a conductive region of the tab portion.

2. The electronic device according to claim 1 wherein the third contact can be used by the electronic device for multiple functions.

3. The electronic device according to claim 1 wherein the request received from the second electronic device comprises a break pulse followed by a command field comprising a plurality of bits.

4. The electronic device according to claim 1 wherein the information sent in response to the request comprises a command response field comprising plurality of bits followed by a payload field comprising a plurality of bits.

5. The electronic device according to claim 1 wherein the request received from the second electronic device comprises a break pulse followed by a command field comprising a plurality of bits and the information sent in response to the request comprises a command response field comprising a plurality of bits followed by a payload field comprising a plurality of bits.

6. The electronic device according to claim 5 wherein the first and second data contacts are differential data contacts and the third and fourth data contacts are serial transmit and receive contacts.

7. The electronic device according to claim 1 wherein the first communication circuitry is USB circuitry.

8. The electronic device according to claim 1 further comprising third and fourth data contacts, wherein:
the identification module stores information comprising a plurality of bits identifying a second communication protocol used by the electronic device to communicate with the second electronic device over the third and fourth data contacts; and
the identification module is further configured to: (i) receive a request from the second electronic device over the third contact to send information that identifies the communication protocol used on the first and second data contacts, and (ii) in response to the request, send information to the second electronic device over the third contact that identifies the first and second communication protocols used by the first and second data contacts and third and fourth data contacts, respectively; and
wherein the electronic device further comprises second communication protocol circuitry, coupled to the third and fourth data contacts, that enables the electronic device to communicate with the second electronic device using the second communication protocol over the third and fourth data contacts.

9. The electronic device according to claim 8 wherein the first communication circuitry is USB circuitry and the second communication circuitry is UART circuitry.

10. The electronic device according to claim 1 further comprising circuitry configured to change the communication protocol used by the electronic device to communicate with the second electronic device over the first and second data contacts from the first communication protocol to a second communication protocol different than the first communication protocol, and wherein the identification module is configured to, after sending the contact configuration information to the second electronic device identifying the first communication protocol, send new contact configuration information to the second electronic device instructing the second electronic device that the first and second data contacts have been changed to carry signals according to the second communication protocol.

11. The electronic device according to claim 1 further comprising a power control module configured to control a power path between the electronic device and the second electronic device.

12. The electronic device according to claim 1 wherein the electronic device is an accessory device.

13. An electronic device comprising:
a first connector configured to be mated with a second connector in a second electronic device, the first connector comprising a plurality of external contacts including first and second data contacts and a third contact;
an identification module storing contact configuration information comprising a plurality of bits that identifies a first communication protocol used by the electronic device to communicate with the second electronic device over the first and second data contacts, the identification module being configured to: (i) receive a request from the second electronic device over the third contact to send contact configuration information identifying the communication protocol used on the first and second data contacts, and (ii) in response to the request, send the contact configuration information to the second electronic device over the third contact;
first communication circuitry, coupled to the first and second data contacts, that enables the electronic device to communicate with the second electronic device using the first communication protocol over the first and second data contacts;
wherein the request received from the second electronic device comprises a break pulse followed by a command field comprising a plurality of bits and the information sent in response to the request comprises a command response field comprising a plurality of bits followed by a payload field comprising a plurality of bits; and the electronic device further comprises an authentication module configured to provide authentication information to the host device to authenticate the electronic device and wherein the authentication module is configured to authenticate the electronic device to the host device prior to the identification device communicating the contact configuration information; and
wherein the first connector includes a tab portion having first and second opposing exterior surfaces, a length extending in a first direction and a width extending in a second direction, the tab portion configured to be inserted into a cavity of the second connector during a mating event, and wherein the plurality of external contacts are positioned in a contact region formed at the first exterior surface of the tab portion, the contact region being fully surrounded in the first and second directions by a conductive region of the tab portion.

14. The electronic device of claim 13 wherein the plurality of external contacts further includes third and fourth data contacts configured to enable communication using a second communication protocol and wherein the contact configuration information further specifies the second communication protocol used by the third and fourth data contacts.

15. The accessory of claim 14 wherein the first communication protocol is a USB protocol and the second communication protocol is a UART protocol.

16. The electronic device of claim 14 wherein the first, the second, the third, and the fourth data contacts can accommodate two of the following three communication interfaces: USB, Mikey Bus, or a universal asynchronous receiver/transmitter interface at any given time.

17. The electronic device of claim 13 wherein the identification device is further configured to switch the communication protocol used for communication over the first and second data contacts during operation of the electronic device from the communication protocol to the second communication protocol and send a message to the host device over the ID contact thereby causing the first and second data contacts to be switched from being operatively coupled to communication circuitry within the electronic device associated with the communication protocol to being operatively coupled to communication circuitry within the electronic device associated with the second communication protocol.

18. A method for operating an accessory having a connector including a plurality of external contacts formed in a contact region at an outer surface of a connector tab that is sized and shaped to be inserted into a cavity of a corresponding receptacle connector during a mating event, the connector tab having a length extending in a first direction and a width extending in a second direction and a conductive portion that fully surrounds the contact region in the first and second directions, the plurality of external contacts including first and second data contacts and a third contact, the method comprising:

storing contact configuration information comprising a plurality of bits that identifies a first communication protocol used by the accessory in a computer-readable memory over the first and second data contacts;

receiving, by the accessory, over the third contact, a first message from a host device coupled to the first connector, the first message requesting the contact configuration information from the accessory; and in response to the first message, sending, by the accessory, a second message to the host device over the third contact, the second message including the contact configuration information.

19. The method of claim 18 further comprising communicating authentication information to the host device prior to receiving the first message from the host device.

20. The method of claim 18 wherein the contact configuration information further comprises information about a type of signal carried by the one or more contacts of the connector, wherein the contact configuration information is used by the host device to impart specific functionality to one or more contacts of a receptacle connector associated with the host device.

* * * * *